US011977940B2

(12) United States Patent
Fujimoto et al.

(10) Patent No.: US 11,977,940 B2
(45) Date of Patent: *May 7, 2024

(54) MEMORY CARD WITH MULTIPLE MODES, AND HOST DEVICE CORRESPONDING TO THE MEMORY CARD

(71) Applicant: Kioxia Corporation, Tokyo (JP)

(72) Inventors: Akihisa Fujimoto, Yamato (JP);
Toshitada Saito, Yokohama (JP);
Noriya Sakamoto, Chigasaki (JP);
Atsushi Kondo, Yokohama (JP)

(73) Assignee: Kioxia Corporation, Tokyo (JP)

( * ) Notice: Subject to any disclaimer, the term of this patent is extended or adjusted under 35 U.S.C. 154(b) by 365 days.

This patent is subject to a terminal disclaimer.

(21) Appl. No.: 17/369,449

(22) Filed: Jul. 7, 2021

(65) Prior Publication Data

US 2021/0334617 A1    Oct. 28, 2021

Related U.S. Application Data

(63) Continuation of application No. 16/619,012, filed as application No. PCT/JP2018/010358 on Mar. 9, 2018, now Pat. No. 11,093,811.

(30) Foreign Application Priority Data

Jun. 5, 2017    (JP) ................................. 2017-111133

(51) Int. Cl.
*G11C 5/02*        (2006.01)
*G06K 19/077*      (2006.01)
(Continued)

(52) U.S. Cl.
CPC . *G06K 19/07732* (2013.01); *G06K 19/07733* (2013.01); *G06K 19/07743* (2013.01);
(Continued)

(58) Field of Classification Search
CPC ....... G11C 5/06; G11C 11/4074; G11C 16/30; G11C 16/00; G06K 19/07732; G06K 19/07733; G06K 19/07743
(Continued)

(56) References Cited

U.S. PATENT DOCUMENTS 8,070,067 B2   12/2011   Liu
8,296,491 B2   10/2012   Pinto
(Continued)

FOREIGN PATENT DOCUMENTS

EP      1 632 886 A1     3/2006
JP      2006-323506 A    11/2006
(Continued)

OTHER PUBLICATIONS

International Search Report and Written Opinion dated Jul. 11, 2018 in PCT/JP2018/010358 filed on Mar. 9, 2018.
(Continued)

*Primary Examiner* — Tha-O H Bui
(74) *Attorney, Agent, or Firm* — Oblon, McClelland, Maier & Neustadt, L.L.P.

(57) ABSTRACT

According to one embodiment, there is provided a memory card including a first surface, a second surface, and $1^{st}$ to $N^{th}$ terminal groups. The first surface includes first to $N^{th}$ rows, where N is an integer of two or greater. The second surface faces the opposite side from the first surface. The $1^{st}$ to $N^{th}$ terminal groups are placed in the first to $N^{th}$ rows. The $1^{st}$ terminal group includes terminals to which differential clock signals are assigned, terminals to which single-ended signals are assigned, and a terminal to which a first power supply voltage is assigned. $K^{th}$ terminal group, where K is an integer no smaller than two and no greater than N, includes terminals to which differential data signals are assigned.

14 Claims, 17 Drawing Sheets

(51) Int. Cl.
  *G11C 5/06* (2006.01)
  *G11C 11/4074* (2006.01)
  *G11C 16/02* (2006.01)
  *G11C 16/30* (2006.01)

(52) U.S. Cl.
  CPC .......... *G11C 5/06* (2013.01); *G11C 11/4074* (2013.01); *G11C 16/02* (2013.01); *G11C 16/30* (2013.01)

(58) Field of Classification Search
  USPC .......................................................... 365/51
  See application file for complete search history.

(56) References Cited

U.S. PATENT DOCUMENTS

| | | | |
|---|---|---|---|
| 9,004,950 B2* | 4/2015 | Nakamura | G06K 19/07743 361/772 |
| 2005/0182881 A1 | 8/2005 | Chou et al. | |
| 2005/0189426 A1 | 9/2005 | Nishizawa | |
| 2005/0281010 A1 | 12/2005 | Wang et al. | |
| 2006/0049265 A1 | 3/2006 | Ho et al. | |
| 2006/0208091 A1 | 9/2006 | Nishizawa | |
| 2010/0049878 A1 | 2/2010 | Yu | |
| 2011/0145465 A1 | 6/2011 | Okada | |
| 2011/0161530 A1 | 6/2011 | Pietri et al. | |
| 2012/0117315 A1 | 5/2012 | Okada | |
| 2013/0012049 A1* | 1/2013 | Pinto | G06F 13/409 439/325 |
| 2013/0059452 A1 | 3/2013 | Nakamura | |
| 2013/0300690 A1 | 11/2013 | Yang | |
| 2014/0258563 A1 | 9/2014 | Otsuka | |
| 2014/0365704 A1 | 12/2014 | Yousuf | |
| 2015/0095687 A1 | 4/2015 | Spry et al. | |
| 2016/0049742 A1 | 2/2016 | Han et al. | |
| 2017/0154003 A1 | 6/2017 | Han et al. | |
| 2017/0192475 A1 | 7/2017 | Fujimoto et al. | |
| 2018/0254252 A1 | 9/2018 | Nakagawa | |

FOREIGN PATENT DOCUMENTS

| | | |
|---|---|---|
| JP | 2009-59252 A | 3/2009 |
| JP | 2011-146020 | 7/2011 |
| JP | 2013-69019 A | 4/2013 |
| JP | 2013-515992 A | 5/2013 |
| JP | 2014-197379 A | 10/2014 |
| JP | 2016-29556 A | 3/2016 |
| JP | 2016-526716 A | 9/2016 |
| JP | 2016-532208 A | 10/2016 |
| TW | I457837 B | 10/2014 |
| TW | 201530318 A | 8/2015 |
| TW | I537835 B | 6/2016 |
| WO | WO 2018/225327 A1 | 12/2018 |

OTHER PUBLICATIONS

Anton Shilov, "Western Digital Demos SD Card with PCIe x1 Interface, 880 MB/s Read Speed" [online], AnandTech, retrieved from the Internet URL:https//www.anandtech.com/show/12487/western-digitaldisplays-sd-card-with-pcie-interface, Feb. 27, 2018, 5 pages.

* cited by examiner

US 11,977,940 B2

MEMORY CARD WITH MULTIPLE MODES, AND HOST DEVICE CORRESPONDING TO THE MEMORY CARD

CROSS-REFERENCE TO RELATED APPLICATIONS

This application is a continuation of U.S. application Ser. No. 16/619,012 filed Dec. 3, 2019, and which is based upon and claims the benefit of priority from Japanese Patent Application No. 2017-111133, filed on Jun. 5, 2017; the entire contents of each of which are incorporated herein by reference.

FIELD

Embodiments described herein relate generally to a memory card, a host device, a connector for the memory card, and an adapter for the memory card.

BACKGROUND

As to memory cards, as the storage capacity increases, the amount of transfer data increases. In order to prevent data transfer time from increasing as the amount of transfer data increases, the communication interface incorporated in the memory card is required to be higher in speed.

CITATION LIST

Patent Literature

[PTL 1] Japanese Patent Application Laid-open No. 2016-29556

DETAILED DESCRIPTION

In general, according to one embodiment, there is provided a memory card including a first surface, a second surface, and $1^{st}$ to $N^{th}$ terminal groups. The first surface includes first to $N^{th}$ rows, where N is an integer of two or greater. The second surface faces the opposite side from the first surface. The $1^{st}$ to $N^{th}$ terminal groups are placed in the first to $N^{th}$ rows. The $1^{st}$ terminal group includes terminals to which differential clock signals are assigned, terminals to which single-ended signals are assigned, and a terminal to which a first power supply voltage is assigned. $K^{th}$ terminal group, where K is an integer no smaller than two and no greater than N, includes terminals to which differential data signals are assigned.

Exemplary embodiments of a memory card, a host device, a connector for the memory card, and an adapter for the memory card will be explained below in detail with reference to the accompanying drawings. The present invention is not limited to the following embodiments.

First Embodiment

Figure 1:
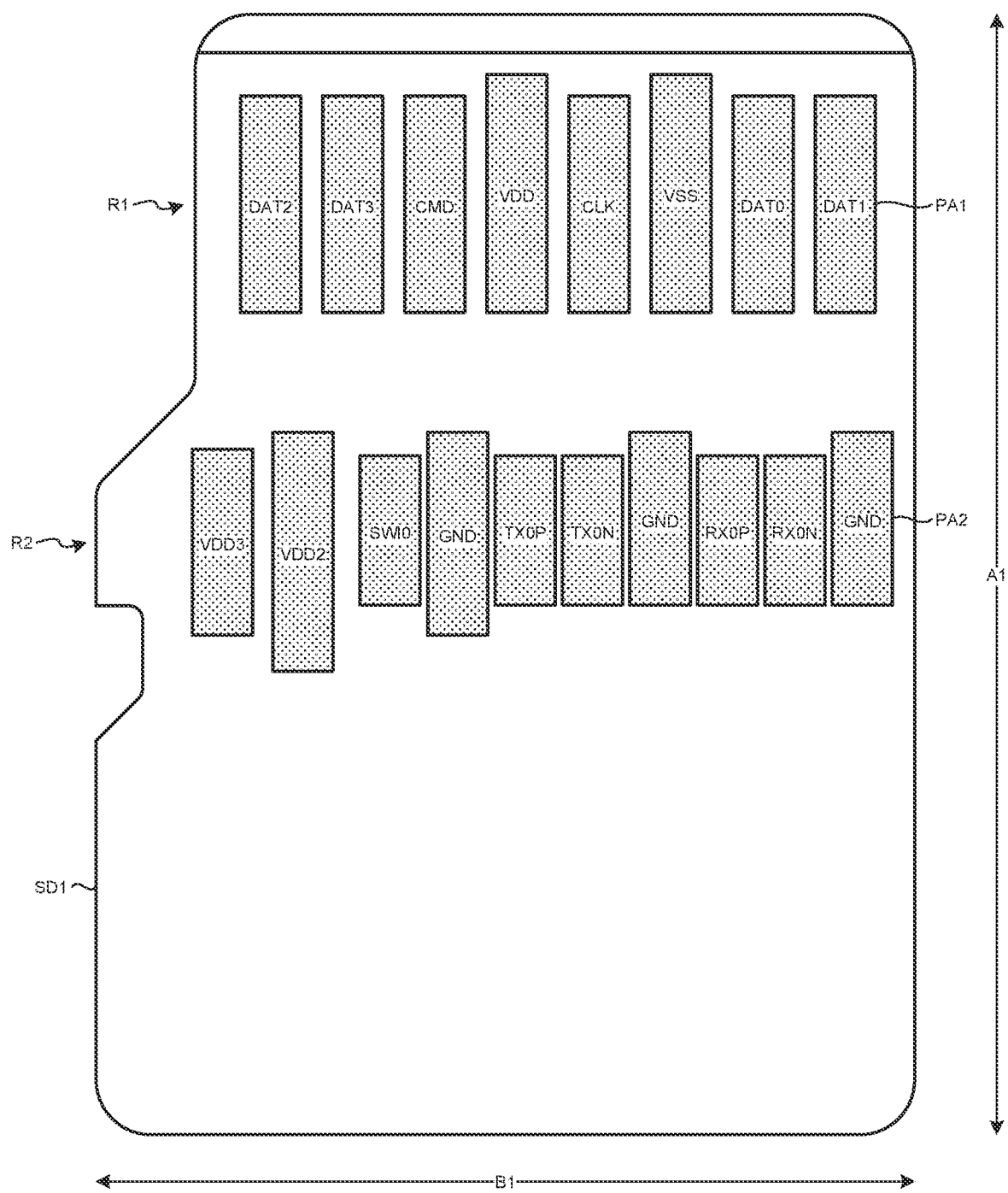
FIG. 1 is a plan view schematically illustrating the configuration of a memory card according to a first embodiment.

FIG. 1 is a plan view schematically illustrating the configuration of a memory card according to a first embodiment. In FIG. 1, rows R1, R2 are provided on the card surface of a memory card SD1. Terminal groups PA1, PA2 are respectively provided in the rows R1, R2. As the row R1, an area where the terminals of the terminal group PA1 are arranged laterally can be designated. As the row R2, an area where the terminals of the terminal group PA2 are arranged laterally can be designated.

The sizes of the terminals of each terminal group PA1, PA2 may be different, and the spaces between the terminals of each terminal group PA1, PA2 may be different. In the row R1, the placement positions of the terminals of the terminal group PA1 may be offset from each other longitudinally. In the row R2, the placement positions of the terminals of the terminal group PA2 may be offset from each other longitudinally.

The form factor of this memory card SD1 can be made to correspond to that of a microSD card. In this case, the longitudinal dimension A1 of the memory card SD1 can be set at 15 mm, and the transverse dimension B1 can be 11 mm, and the thickness can be 1.0 mm.

Signals used in communication compliant with one interface standard are assigned to each row R1, R2. It is possible not to assign signals used in communication compliant with a plurality of interface standards to one row. Note that signals used in communication compliant with one interface standard may be assigned to a plurality of rows.

Signals used in communication in a first mode compliant with the SD standard are assigned to the row R1. Communication in the first mode compliant with the SD standard can use single-ended signals. That is, single-ended signals are compliant with the SD standard. In the first mode compliant with the SD standard, a power supply VDD, ground potential VSS, a command CMD, a clock CLK, and data DAT[3:0] are assigned to the terminal group PA1.

In the first mode compliant with the SD standard, communication compliant with Default Speed (DS), High Speed (HS), or Ultra High Speed (UHS)-I is possible. The maximum transfer speed of the DS is 12.5 Mbytes/sec; the maximum transfer speed of the HS is 25 Mbytes/sec; and the maximum transfer speed of the UHS-I is 104 Mbytes/sec.

Signals used in communication in a second mode compliant with the Peripheral Component Interconnect express (PCIe) standard are assigned to the row R2. Communication in the second mode compliant with the PCIe standard can use differential signals in data communication. In the second mode compliant with the PCIe standard, transmit differential signals TX0P, TX0N and receive differential signals RX0P, RX0N are assigned to the terminal group PA2. By using the transmit differential signals TX0P, TX0N and receive differential signals RX0P, RX0N, bidirectional communication can be performed. In this case, in the row R2, GND terminals at ground potential are assigned in such a way that terminals to which differential signals are assigned are placed between the GND terminals.

Further, in the row R2, a power supply terminal VDD3 is assigned to one terminal of the terminal group PA2, and a power supply terminal VDD2 is assigned to another terminal of the terminal group PA2. SWIO is assigned to yet another terminal of the terminal group PA2. The SWIO can be used in Near Field Communication (NFC).

In the first mode compliant with the SD standard, the clock CLK and data DAT[3:0] are assigned to different terminals. Thus, the clock CLK and data DAT[3:0] are transmitted via different transmission paths.

In the second mode compliant with the PCIe standard, while data is serially transmitted, data is coded on a unit basis in such a way that the same voltage level does not last long so that the receiving circuit can generate a clock. In coding, a method such as 8B10B or 128b/130b is used. The receiving side generates a clock from data change points so as to be able to receive data even with some voltage level fluctuation. If there are a plurality of lanes (a pair of upbound and downbound differential data signals), by configuring receiving circuits on their respective lanes independently to make the start positions of receive data coincide, skew between the lanes can be reduced to zero.

The maximum transfer speed in the second mode compliant with, e.g., the PCIe 3.0 standard is 2 Gbytes/sec per lane (the total of up and down). In the second mode compliant with the PCIe standard, a set of the transmit differential signals TX0P, TX0N and receive differential signals RX0P, RX0N can form one lane. A set of the transmit differential signals TX0P, TX0N and receive differential signals RX0P, RX0N can be placed in one row of the memory card SD1.

Hence, by increasing the number of rows of the memory card SD1, the number of lanes of the second mode compliant with the PCIe standard can be increased, so that the transfer speed in the second mode compliant with the PCIe standard can be improved. In the second mode compliant with the PCIe standard, at the time of initialization, a multiple-lane configuration is recognized, and one block of data can be transferred on multiple lanes.

Where communication in the second mode compliant with the PCIe standard is performed, control signals used to control communication in the second mode compliant with the PCIe standard are assigned to the row R1. As these control signals, reference differential clock signals REFCLKp/n, a reset signal PERST, a power management control signal CLKREQ, and a wakeup signal PEWAKE can be used. These control signals are assigned instead of the command CMD and data DAT[3:0] in the row R1.

The two of the reference differential clock signals REFCLKp/n form a differential clock, and the host device sending the clock can facilitate the memory card SD1 synchronizing with the host device to which the memory card SD1 is attached. The reference differential clock signals REFCLKp/n are assigned to the row R1, and the transmit differential signals TX0P, TX0N and receive differential signals RX0P, RX0N are assigned to the row R2 or a row numbered later. Hence, the reference differential clock signals REFCLKp/n are transmitted via a transmission path different than the transmit differential signals TX0P, TX0N and receive differential signals RX0P, RX0N.

The host device is, for example, an information processing device such as a personal computer, a mobile phone, a digital camera, or an image pickup device, or a mobile terminal such as a tablet computer or a smart phone, or a game machine, or an in-vehicle terminal such as a car navigation system.

The memory card SD1 multiplies the frequency of the received reference differential clock to generate a bit clock. Data is output from the transmit differential signals TX0P, TX0N in synchronization with the bit clock, and data read from the receive differential signals RX0P, RX0N is put in order in synchronization with the bit clock. Even in the case of multiple lanes, read data can be put in order as one block of data in synchronization with the bit clock.

The reset signal PERST can be used for the host device to reset a bus used in communication in the second mode compliant with the PCIe standard. The host device can use this reset signal PERST to reinitialize the card when an error has occurred or so on.

The power management control signal CLKREQ can be used as a clock to return from a power saving mode. In the power saving mode, a high frequency bit clock used for data transfer is stopped, so that power consumption can be reduced.

When the wakeup signal PEWAKE is implemented in the memory card SD1, the wakeup signal PEWAKE can be used for the memory card SD1 to notify various events to the host device in the power saving mode. When receiving the wakeup signal PEWAKE from the memory card SD1, the host device unsets the power saving mode so as to be able to process an event. There is a type that incorporates an I/O function among memory cards, and this signal can be used as a means for notifying I/O interrupts.

In the row R2, a power supply terminal VDD3 is assigned to one terminal of the terminal group PA2. The host device can supply a power supply voltage VDD1 to the power supply VDD of the row R1. The power supply voltage VDD1 can be set at 3.3 V. The power supply voltage VDD2 can be supplied to the power supply terminal VDD2 of the row R2. The power supply voltage VDD2 can be set at 1.8V. Alternatively, a power supply voltage VDD3 can be supplied to the power supply terminal VDD3 of the row R2. The power supply voltage VDD3 can be set at 1.2 V. The power supply voltage representation denotes a median value, and a voltage fluctuation range of some size is allowed. For example, the permissible range is 2.7 V to 3.6 V for 3.3 V, 1.70 V to 1.95 V for 1.8 V, and 1.1 V to 1.3 V for 1.2 V.

In the description below, description is made assuming the presence of the power supply terminal VDD3, but where the memory card SD1 supporting the power supply voltage VDD3 does not have the power supply terminal VDD3, the power supply voltage VDD2 or VDD3 can be supplied through the power supply terminal VDD2 of the row R2. Specifically, 1.8 V or 1.2 V is applied as the power supply voltage VDD2. That is, although there are cases where the memory card SD1 does not have the power supply terminal VDD3, the description is the same except that the supply destination of the power supply voltage VDD3 changes to the power supply terminal VDD2.

Although in the above description a method of assigning signals used in communication in the second mode compliant with the PCIe standard to the row R2 has been described, signals used in communication according to UHS-II may be assigned to the row R2. The maximum transfer speed of the UHS-II is 312 Mbytes/sec.

In order to make it possible to determine whether the memory card SD1 is to communicate in the second mode compliant with the UHS-II standard or in the second mode compliant with the PCIe standard, the power supply voltage VDD2 or the power supply voltage VDD3 can be used. When the power supply voltage is applied to the power supply terminal VDD2 or the power supply terminal VDD3 of the terminal group PA2, if supporting the UHS-II, the memory card SD1 can communicate using a UHS-II bus mode. When the power supply voltage VDD3 is applied to the power supply terminal VDD3 of the terminal group PA2, if supporting the PCIe standard, the memory card SD1 can communicate in a PCIe bus mode.

Alternatively, a method of switching by detecting variation point of the power supply voltage VDD2 or the power supply voltage VDD3. When the power supply voltage VDD2 or the power supply voltage VDD3 changes from off state to on state, the memory card SD1 enters the PCIe bus mode. When the power supply voltage VDD2 or the power supply voltage VDD3 changes from on state to off state, the memory card SD1 escapes from the PCIe bus mode. In this way, in the SD mode, the memory card SD1 can operate in either state of on/off of VDD2 or VDD3.

The host device using the UHS-II standard applies the power supply voltage VDD2 to the power supply terminal VDD2, and the host device using the PCIe standard applies the power supply voltage VDD2 to the power supply terminal VDD2 or applies the power supply voltage VDD3 to the power supply terminal VDD3. The memory card SD1 can easily determine which bus mode the host device expects from the combination of the presence or absence of VDD2 and VDD3 voltages. Thus, the memory card SD1 does not need to determine the bus mode from a symbol transmitted in data.

Here, in order to make it possible for the host device to recognize whether the memory card SD1 supports the PCIe standard or the UHS-II standard, the host device compliant with the PCIe standard can transmit a PCIe symbol decided on to recognize that the PCIe standard is supported to the terminal group PA2 of the row R2. When receiving a response to that symbol from the memory card SD1, the host device can recognize that the memory card SD1 supports the PCIe standard. The host device compliant with the UHS-II can transmit a UHS-II initialization symbol to the terminal group PA2 of the row R2. When receiving a response to that symbol from the memory card SD1, the host device can recognize that the memory card SD1 supports the UHS-II.

By assigning signals used in communication in the second mode compliant with the PCIe standard to the row R2 and making it possible for the memory card SD1 to support communication according to the PCIe standard, data transfer speed can be increased. As the storage capacity of the memory card SD1 increases, the time required for accessing the entire memory area increases, but by making the bus further higher in speed by a method such as the multi-lane configuration, this time can be reduced.

When the memory card SD1 supports communication according to the PCIe standard, the normal physical layer (PHY) of the PCIe standard can be used. Hence, design to increase the data transfer speed of the memory card SD1 can be facilitated, and the development cost can be reduced.

Further, when the memory card SD1 supports communication according to the PCIe standard, a Non-Volatile Memory express (NVMe) can be adopted as the data link layer of the PCIe standard. Hence, overhead in data transfer can be reduced, and data transfer efficiency can be improved.

Second Embodiment

Figure 2:
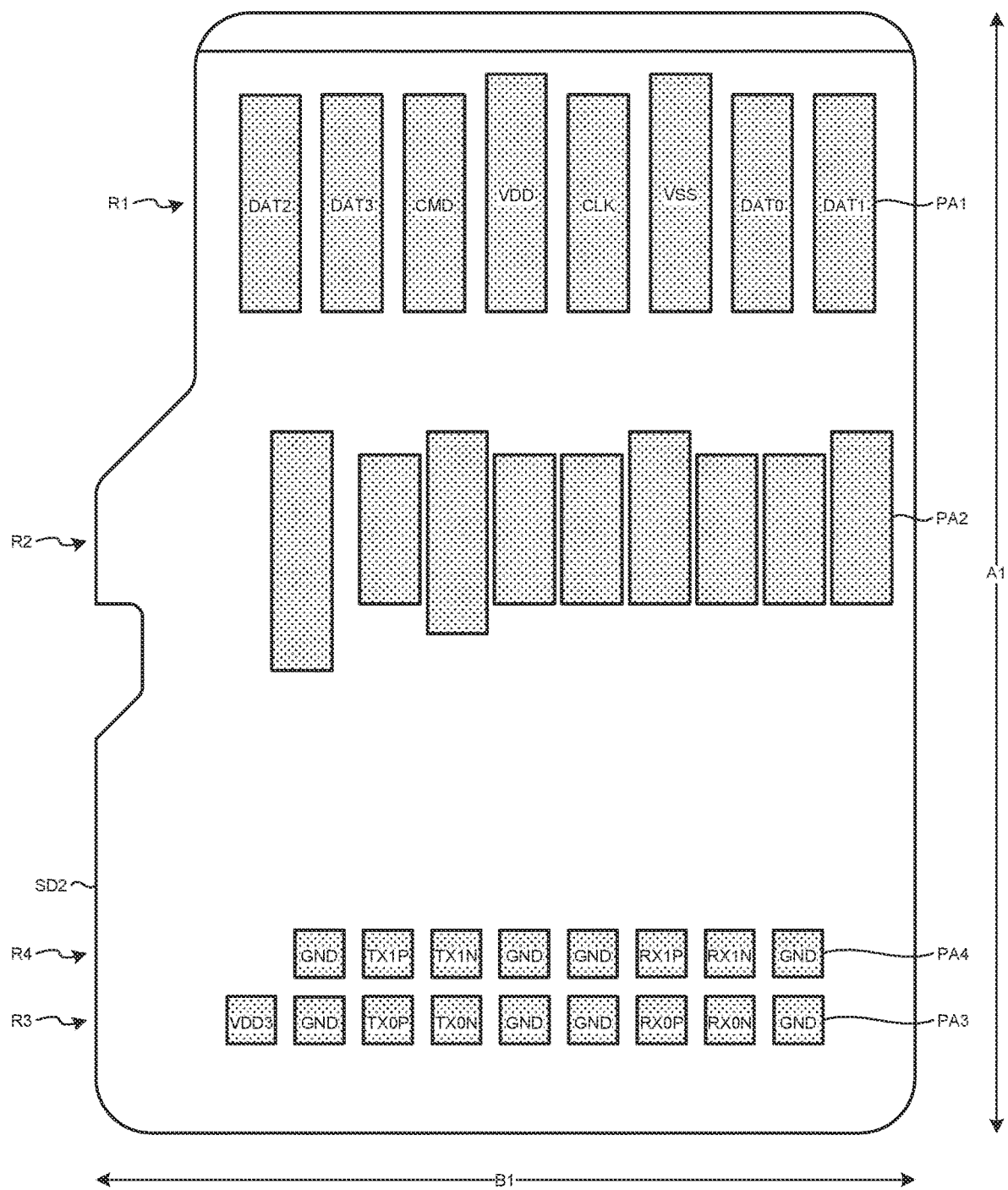
FIG. 2 is a plan view schematically illustrating the configuration of a memory card according to a second embodiment.

FIG. 2 is a plan view schematically illustrating the configuration of a memory card according to a second embodiment.

In FIG. 2, rows R1 to R4 are provided on the card surface of a memory card SD2. Terminal groups PA1, PA2 are respectively provided in the rows R1, R2. The rows R1, R2 can be used as in the memory card SD1 of FIG. 1. For example, the row R2 can support the UHS-II, and the rows R3, R4 can support the PCIe standard.

Terminal groups PA3, PA4 are respectively provided in the rows R3, R4. As the row R3, an area where the terminals of the terminal group PA3 are arranged laterally can be designated. As the row R4, an area where the terminals of the terminal group PA4 are arranged laterally can be designated. The form factor of this memory card SD2 can be made to correspond to that of a microSD card. Note that if the rows R3, R4 are provided on the memory card SD2, the row R2 can be optional (not necessarily needed).

Although FIG. 2 shows an example where the rows R3, R4 are configured in two tiers, each row shows a group of terminals necessary for forming one lane and does not limit the terminal placement on the memory card. For example, pads in two tiers may be staggered, or the rows R3, R4 may be placed to form a line shaped like a U laid on its side.

The area of each terminal of the terminal groups PA3, PA4 may be smaller than that of each terminal of the terminal groups PA1, PA2. The terminals of the terminal groups PA3, PA4 can be the same in shape depending on the contact method of the connector. By making the area of each terminal of the terminal groups PA3, PA4 smaller, parasitic capacitance can be reduced, and also stubs when the terminals are in contact can be made smaller, so that frequency characteristics can be improved. Here, the stub refers to a piece of a terminal not touching a connector pin when the terminals of the memory card SD2 are in contact. By making the terminals of the terminal groups PA3, PA4 the same in shape, electrical characteristics of differential signals forming a lane can be improved in terms of symmetry.

Signals used in communication according to the PCIe standard are assigned to the rows R3, R4. Transmit differential signals TX0P, TX0N and receive differential signals RX0P, RX0N are assigned to the terminal group PA3 of the row R3. Transmit differential signals TX1P, TX1N and receive differential signals RX1P, RX1N are assigned to the terminal group PA4 of the row R4.

Here, one row can form one lane of the PCIe standard. Hence, by assigning signals used in communication according to the PCIe standard to the rows R3, R4, two lanes of the PCIe standard can be formed, so that data transfer speed can be improved to be doubled as compared with a method in which signals used in communication according to the PCIe standard are assigned to one row.

Also in the case of performing communication according to the PCIe standard using the two rows R3, R4, control signals used to control communication according to the PCIe standard are assigned to the row R1. In this case, the control signals assigned to the row R1 can be shared by the two rows R3, R4.

In the row R3, a power supply terminal VDD3 is assigned to one terminal of the terminal group PA3. A power supply voltage VDD3 can be supplied to the power supply terminal VDD3. The power supply terminal VDD3 of the terminal group PA3 can be shared by the two rows R3, R4. In order to make it possible to determine whether the memory card SD2 is to communicate in the first mode compliant with the SD standard or in the second mode compliant with the PCIe standard, the power supply voltage VDD3 can be used.

In each row R3, R4, GND terminals at ground potential are assigned in such a way that terminals to which differential signals are assigned are placed between the GND terminals. For example, in the row R3, differential signals RX0N, RX0P, TX0N, TX0P are assigned to the second, third, sixth, and seventh terminals from the right. In this case, ground potential GND is assigned to the first, fourth, fifth, and eighth terminals from the right in the row R3.

Figure 3:
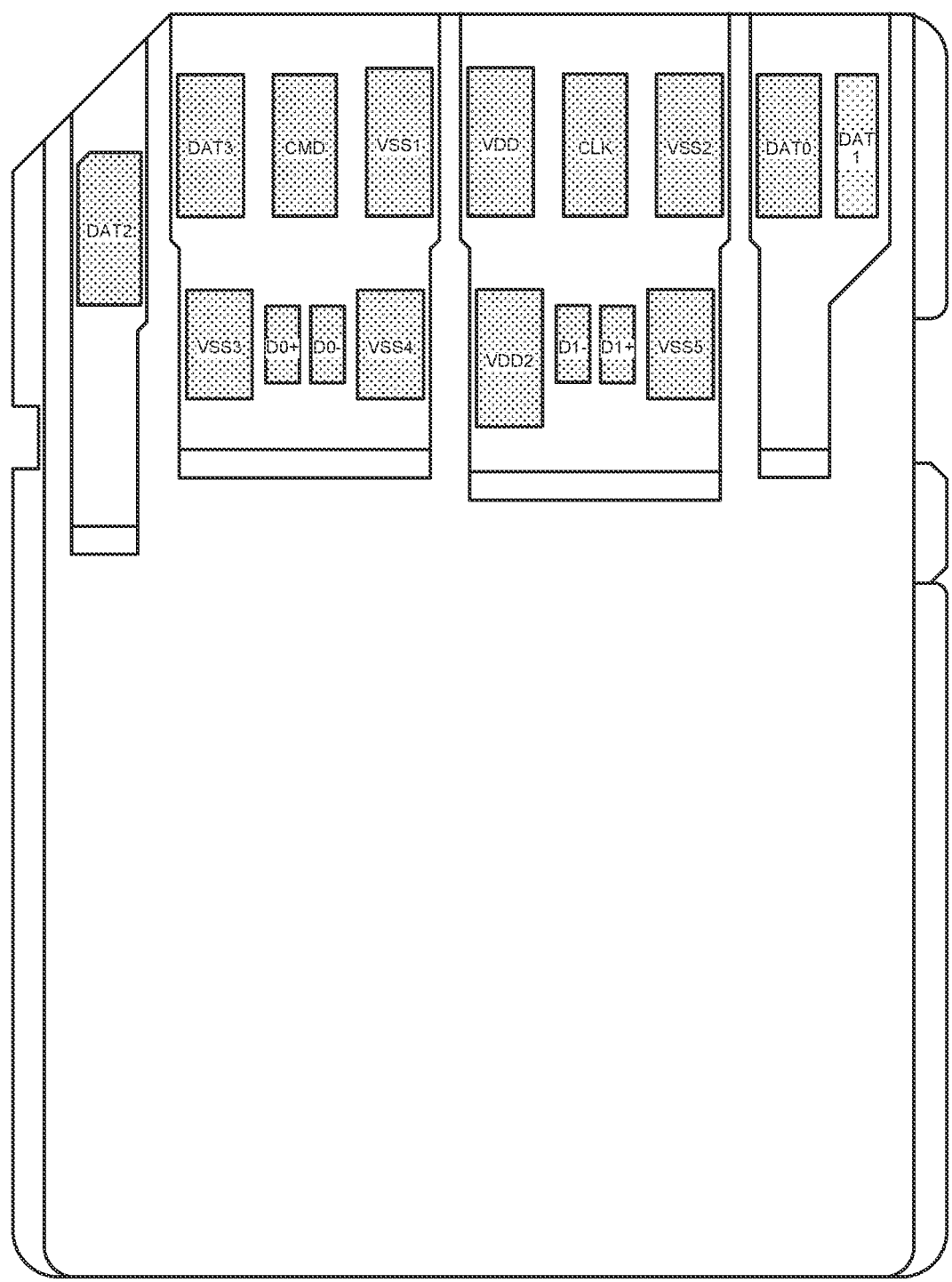
FIG. 3 is a plan view schematically illustrating another configuration of a memory card according to a second embodiment.

It should be noted that the memory card may be, with compared with the arrangements shown in FIG. 2, the arrangement shown in FIG. 3 where a power supply terminal is substituted for one GND terminal between two GND terminals surrounding differential signal terminals. The power supply terminal can be used with a power supply terminal corresponding to a stable power supply. FIG. 3 is a plan view schematically illustrating another configuration of a memory card according to a second embodiment.

By assigning ground potential GND to terminals between which are placed terminals having differential signals assigned thereto, a return path can be secured for each differential signal, so that mutual interference between the differential signals can be reduced.

It should be noted that, although the example of FIG. 2 or FIG. 3 describes the method in which ground potential GND is assigned independently to each differential signal, if there is an enough noise margin for mutual interference between the differential signals, terminals adjacent to each other to which ground potential GND are assigned may be reduced to a common one. For example, in the row R3, either of the fourth and fifth terminals from the right to which ground potential GND are assigned can be omitted. By this means, the number of terminals provided in each row R3, R4 can be reduced, so that, if there is a limit on the number of terminals that can be arranged in one row of the memory card SD2, the limit can be easily complied with.

Although the example of FIG. 2 or FIG. 3 describes the method in which the rows R3, R4 are provided on the memory card SD2, the row R4 can be omitted.

Although the example of FIG. 2 or FIG. 3 describes the method in which the two rows R3, R4 are provided in addition to the rows R1, R2, three or more rows may be provided in addition to the rows R1, R2. For example, rows R5, R6 may be further added. Since the memory card SD2 supports communication according to the PCIe standard, an increase in the number of rows can increase the number of lanes, so that an increase in the data transfer speed can be easily dealt with.

That is, N rows, where N is an integer of two or greater, can be provided on the card surface of a memory card. And in the first row, data can be communicated in the first mode compliant with the SD standard, and in the second to Nth rows, data can be communicated in the second mode compliant with the PCIe standard. The second row may be assigned as a PCIe lane, but need not be used, because the shape of pads is different than in the row R3 and rows numbered subsequently. Letting X be the number of PCIe lanes, data can be communicated using X lanes with the PCIe standard, and the maximum transfer speed of, e.g., the PCIe 3.0 standard can reach X×2 Gbytes/sec (in bidirectional transfer).

Third Embodiment

Figure 4:
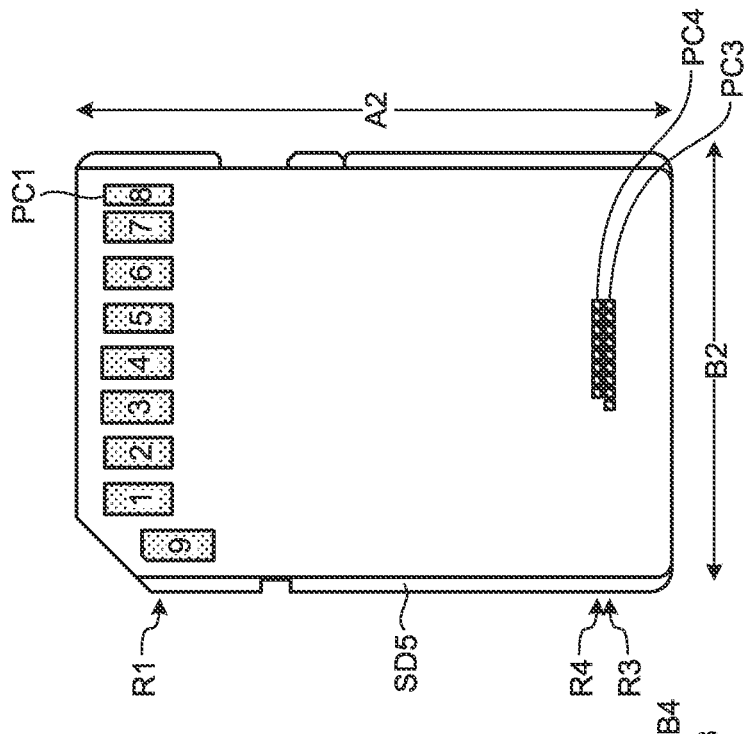
FIG. 4A is a plan view schematically illustrating the configuration of a memory card according to a third embodiment.
FIG. 4B is a plan view schematically illustrating the configuration of a memory card according to a fifth embodiment.
FIG. 4C is a plan view schematically illustrating the configuration of a memory card according to a fourth embodiment.

FIG. 4A is a plan view schematically illustrating the configuration of a memory card according to a third embodiment.

In the microSD form factor, there are three combinations of the presence or absence of the row R2 and the presence or absence of the rows R3, R4.

(1) The case where the row R2 is present and where the rows R3, R4 are absent (case of FIG. 1)

One lane of differential signals of the UHS-II or differential signals of the PCIe standard is assigned to the row R2. Which is supported is determined at the time of initialization (both may be supported). Further, there is a choice of the presence or absence of the power supply terminal VDD3 in the row R2, and if the power supply terminal VDD3 is present, 1.2 V is applied thereto. If the power supply terminal VDD3 is absent, the power supply terminal VDD2 is used, and 1.8 V or 1.2 V is applied to the power supply terminal VDD2.

(2) The case where the row R2 is absent and where the rows R3, R4 are present (case of FIG. 4A)

Two lanes of differential signals of the PCIe standard are assigned to the rows R3, R4. The power supply voltage VDD3 is in the row R3. The UHS-II cannot be supported.

(3) The case where the row R2 is present and where the rows R3, R4 are present (case of FIG. 2)

Differential signals of the UHS-II are assigned to the row R2, and two lanes of differential signals of the PCIe standard are assigned to the rows R3, R4. Further, there is a choice of the presence or absence of the power supply terminal VDD3 in the row R2, and if the power supply terminal VDD3 is present, 1.2 V is applied thereto. If the power supply terminal VDD3 is absent, the power supply terminal VDD2 is used, or the power supply terminal VDD3 of the row R3 may be used. If the power supply terminal VDD2 is used, 1.8 V or 1.2 V is applied thereto. When in the second mode compliant with the PCIe standard, the row R2 can be used for an interface for another application.

The rows R1, R3, R4 of the memory card SD3 can be used in the same way as the rows R1, R3, R4 of the memory card SD2 of FIG. 2.

By removing the row R2 of the memory card SD2, empty space on the card surface of the memory card SD3 can be increased. The space can be used as, for example, a contact area for heat radiation.

Fourth Embodiment

FIG. 4C is a plan view schematically illustrating the configuration of a memory card according to a fourth embodiment.

In FIG. 4C, rows R1, R3, R4 are provided on the card surface of a memory card SD5. A terminal group PC1 is provided in the row R1. Signals used in communication in the first mode compliant with the SD standard are assigned to the row R1. In this case, a power supply VDD is assigned to terminal 4; ground potential VSS is to terminals 3, 6; a command CMD is to terminal 2; a clock CLK is to terminal 5, and data DAT[3:0] is to terminals 1, 9, 8, 7.

Terminal groups PC3, PC4 are respectively provided in the rows R3, R4 and can form a two-lane configuration. The form factor of this memory card SD5 can be made to correspond to that of the standard-size SD card. In this case, the longitudinal dimension A2 of the memory card SD5 can be set at 32 mm, and the transverse dimension B2 can be 24 mm, and the thickness can be 2.1 mm.

The rows R1, R3/R4 of the memory card SD5 can be used in the same way as the rows R1, R3, R4 of the memory card SD2. Thus, also in the case where the form factor of the memory card SD5 corresponds to that of the standard-size SD card, communication in the second mode compliant with the PCIe standard can be supported, so that data transfer speed can be increased.

Fifth Embodiment

FIG. 4B is a plan view schematically illustrating the configuration of a memory card according to a fifth embodiment.

In FIG. 4B, rows R1, R3, R4 are provided on the card surface of a memory card SD4. A terminal group PB1 is provided in the row R1. Signals used in communication in the first mode compliant with the SD standard are assigned to the row R1. An example of the case where the terminal group PB1 of FIG. 4B is in the same shape as the terminal group PA1 of FIG. 4A is shown, but the terminal group PB1 may be in the same shape as the terminal shape of the rows R3, R4, or in the shape of a similar smaller pad. By using an adapter to convert the form factor to that of FIG. 4C, the memory card can be made to maintain compatibility.

Terminal groups PB3, PB4 are respectively provided in the rows R3, R4. The form factor of the memory card SD4 can encompass the form factor corresponding to the microSD card in volume and be encompassed by the form factor corresponding to the standard-size SD card in volume. In this case, the longitudinal dimension A3 of the memory card SD4 can be set to be in the range of 16 mm to 20 mm, and the transverse dimension B3 can be in the range of 12 mm to 16 mm, and the thickness can be in the range of 1.4 mm to 1.6 mm.

Since the form factor of the memory card SD4 encompasses the form factor corresponding to the microSD card in volume, a NAND flash memory can be accommodated in the memory card SD4 even if the chip size of the NAND flash memory is increased, so that an increase in the storage capacity of the NAND flash memory can be dealt with.

The form factor of the memory card SD4 is encompassed by the form factor corresponding to the standard-size SD card in volume, so that an increase in the size of the memory card SD4 can be suppressed. Thus, the compactness of the memory card SD4 can be secured, so that the memory card SD4 can be used in a mobile terminal such as a smart phone, a mobile device such as a digital camera, or the like.

The rows R1, R3, R4 of the memory card SD4 can be used in the same way as the rows R1, R3, R4 of the memory card SD5 and the rows R1, R3, R4 of the memory card SD3. Thus, also in the case where the form factor of the memory card SD4 is different from the form factors of the microSD card and of the standard-size SD card, communication according to the PCIe standard can be supported, so that the memory area can be accessed regardless of the difference in form factor.

It should be noted that the size, shape, and spacing of terminals arranged in the rows R3, R4 can be made common to the memory cards SD2 to SD5. Thus, the connector to be in contact with terminals arranged in the rows R3, R4 can be made common to the memory cards SD2 to SD5.

Sixth Embodiment

Figure 5:
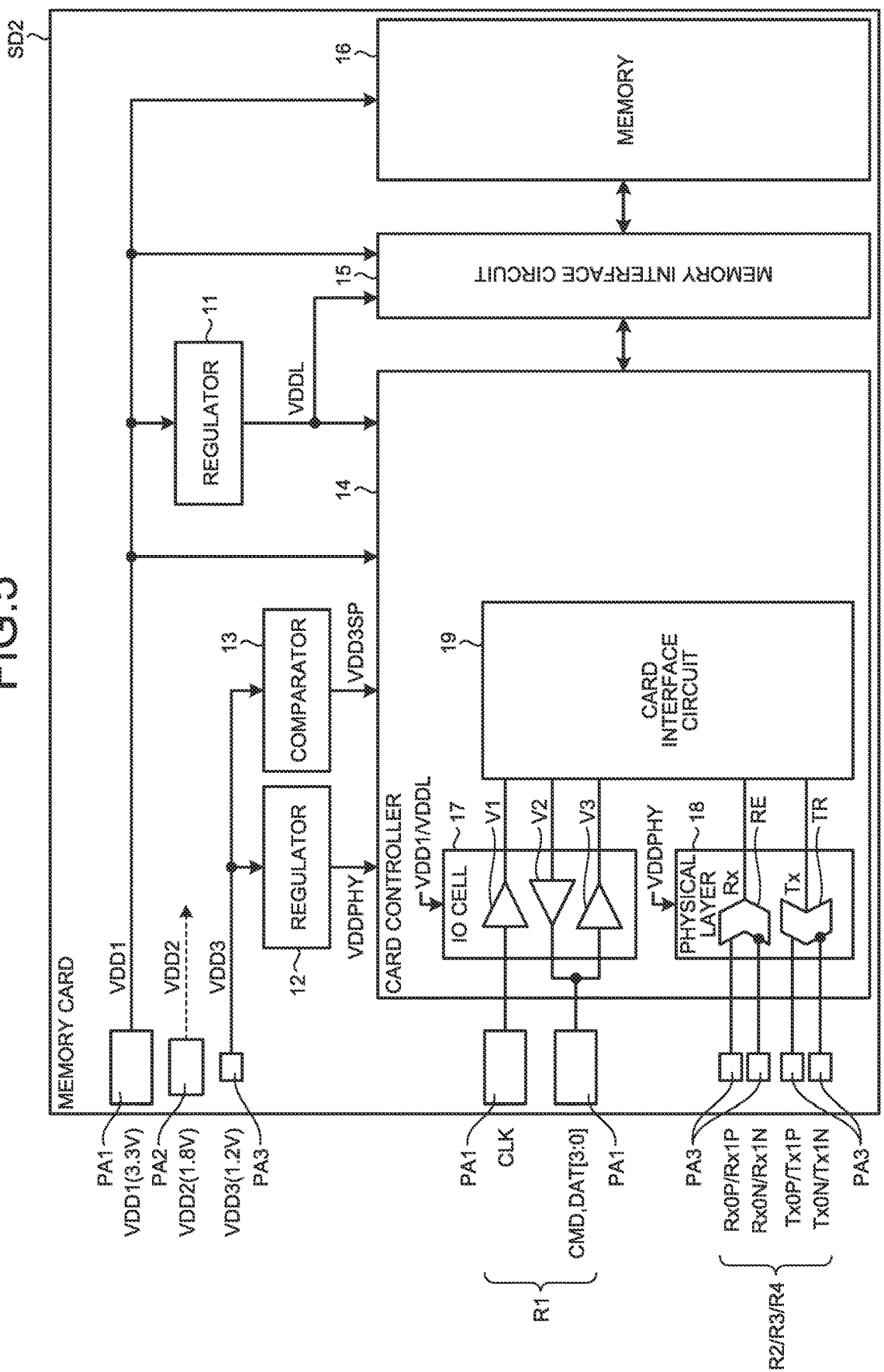
FIG. 5 is a block diagram schematically illustrating the configuration of a memory card according to a sixth embodiment.

FIG. 5 is a block diagram schematically illustrating the configuration of a memory card according to a sixth embodiment. The configuration of FIG. 5 can apply to any of the memory cards SD1 to SD5 of FIGS. 1, 2, and 3A to 3C. The description below takes as an example the case where the configuration of FIG. 5 is applied to the memory card SD2 of FIG. 2.

In FIG. 5, regulators 11, 12, a comparator 13, a card controller 14, a memory interface circuit 15, and a memory 16 are provided in the memory card SD2. A NAND flash memory can be used as the memory 16. The card controller 14 can perform the control of reading/writing from/into the memory 16, the control of communication with the outside, and so on. This communication control can include protocol control for the first mode compliant with the SD standard and protocol control compliant with the PCIe standard. An IO cell 17, a physical layer interface 18, and a card interface circuit 19 are provided in the card controller 14.

The IO cell 17 can deal with single-ended signals. The IO cell 17 can deal with signals assigned to the row R1. Input buffers V1, V3 and an output buffer V2 are provided in the IO cell 17. A clock CLK can be inputted to the input buffer V1. The command CMD and data DAT[3:0] can be inputted to the input buffer V3. The output buffer V2 can output a response to the command CMD and data DAT[3:0]. The input buffer V3 and the output buffer V2 can be provided for each of the command CMD and data DAT[3:0].

The physical layer interface 18 can deal with differential signals. The physical layer interface 18 can deal with signals assigned to the rows R2, R3, R4. A receiver RE and a transmitter TR are provided in the physical layer interface 18. Receive differential signals RX0P, RX0N of the rows R2, R3 and receive differential signals RX1P, RX1N of the row R4 can be inputted to the receiver RE. The transmitter TR can output transmit differential signals TX0P, TX0N of the rows R2, R3 and transmit differential signals TX1P, TX1N of the row R4. The receiver RE and transmitter TR can be provided for each row R2, R3, R4. In the row R2, the physical layer interface 18 can take on the same configuration for either of the second mode compliant with the UHS-II standard and the second mode compliant with the PCIe standard.

The IO cell 17 and the physical layer interface 18 are connected to the card interface circuit 19. The card interface circuit 19 is connected to the memory 16 via the memory interface circuit 15. In order to make the memory card SD2 support the PCIe standard, the data link layer and transaction layer of the PCIe standard as well as the physical layer interface 18 of the PCIe standard can be provided in the card controller 14. The physical layer interface 18 can perform serial/parallel conversion, parallel/serial conversion, data symbolization, and so on. This symbolization is a process that suppresses the number of consecutive occurrences of the same value to a predetermined value or less when consecutive 0s or 1s are present in data. By this symbolization, bias in the voltage level in data transmission can be suppressed. Further, by using such symbols that harmonics of specific frequencies are not large, electromagnetic interference (EMI) can be suppressed.

It should be noted that the transaction layer of the PCIe standard can packetize data and add commands or the like to the headers of packets. The data link layer of the PCIe standard can add sequence numbers and cyclic redundancy check (CRC) codes to packets received from the transaction layer. The sequence numbers can be used to verify packet delivery or so on.

The power supply voltage VDD1 is supplied to the regulator 11, card controller 14, memory interface circuit 15, and memory 16. The power supply voltage VDD1 supplied to the regulator 11 is converted into a power supply voltage VDDL, which is supplied to the card controller 14 and the memory interface circuit 15. The power supply voltage VDDL is determined according to the technology of the card controller. The memory interface circuit 15 is a level shifter circuit if the interface voltages of the card controller 14 and of the memory 16 are different.

In the case of the first mode (DS, HS, or UHS-I) compliant with the SD standard, the memory card is configured to be operable with only the power supply voltage VDD1. In the case of the UHS-7 mode, the card controller 14 and memory interface circuit 15 can use the power supply voltage VDDL of 1.8 V. In this case, the IO cell 17 can switch the output signal voltage and input threshold according to the power supply voltages VDD1, VDDL. The supply of the voltage VDD2 can be optional.

The power supply voltage VDD3 is supplied to the regulator 12 and the comparator 13. The power supply voltage VDD3 supplied to the regulator 12 is converted into a power supply voltage VDDPHY necessary to allow the physical layer interface 18 to operate, which is supplied to the physical layer interface 18.

The power supply voltage VDD3 supplied to the comparator 13 is compared with a reference voltage. And on the basis of the comparing result, the application of the power supply voltage VDD3 is detected, so that a detection signal VDD3SP is outputted to the card controller 14.

Although now shown in Figures, similar to a case of using the power supply voltage VDD2, the power supply voltage VDD2 is supplied to the regulator 12 and the comparator 13 to be inverted to the power supply voltage needed for causing the physical layer interface 18 to operate, to be supplied to the physical layer interface 18, so that the card detection signal VDD3SP is output to the card controller 14.

If the application of the power supply voltage VDD3 is not detected by the comparator 13, the memory card SD2 communicates in the first mode compliant with the SD standard. At this time, the clock CLK transmitted from the host device to the memory card SD2 is transmitted to the card interface circuit 19 via the input buffer V1. The command CMD and data DAT [3:0] transmitted from the host device to the memory card SD2 are transmitted to the card interface circuit 19 via the input buffer V3. A response to the command CMD and data DAT[3:0] transmitted from the card interface circuit 19 are transmitted to the host device via the output buffer V2.

If the application of the power supply voltage VDD2 or the power supply voltage VDD3 is detected by the comparator 13, the memory card SD2 communicates in the second mode compliant with the PCIe standard. At this time, the memory card SD2 can communicate data via the rows R3, R4 and control signals via the row R1. As the control signals, the reference differential clock signals REFCLKp/n, reset signal PERST, power management control signal CLKREQ, and wakeup signal PEWAKE are assigned instead of the command CMD and data DAT [3:0] in the row R1. It should be noted that implementation of the wakeup signal PEWAKE is not always needed.

When the receive differential signals RX0P, RX0N, RX1P, RX1N that are serial signals are transmitted from the host device to the memory card SD2, the receiver RE converts them into a received signal Rx that is parallel data, which is transmitted to the card interface circuit 19. When a transmit signal Tx that is parallel data is transmitted from the card interface circuit 19 to the transmitter TR, the transmit signal Tx is converted into transmit differential signals TX0P, TX0N, TX1P, TX1N that are serial signals, which are transmitted to the host device.

Seventh Embodiment

Figure 6:
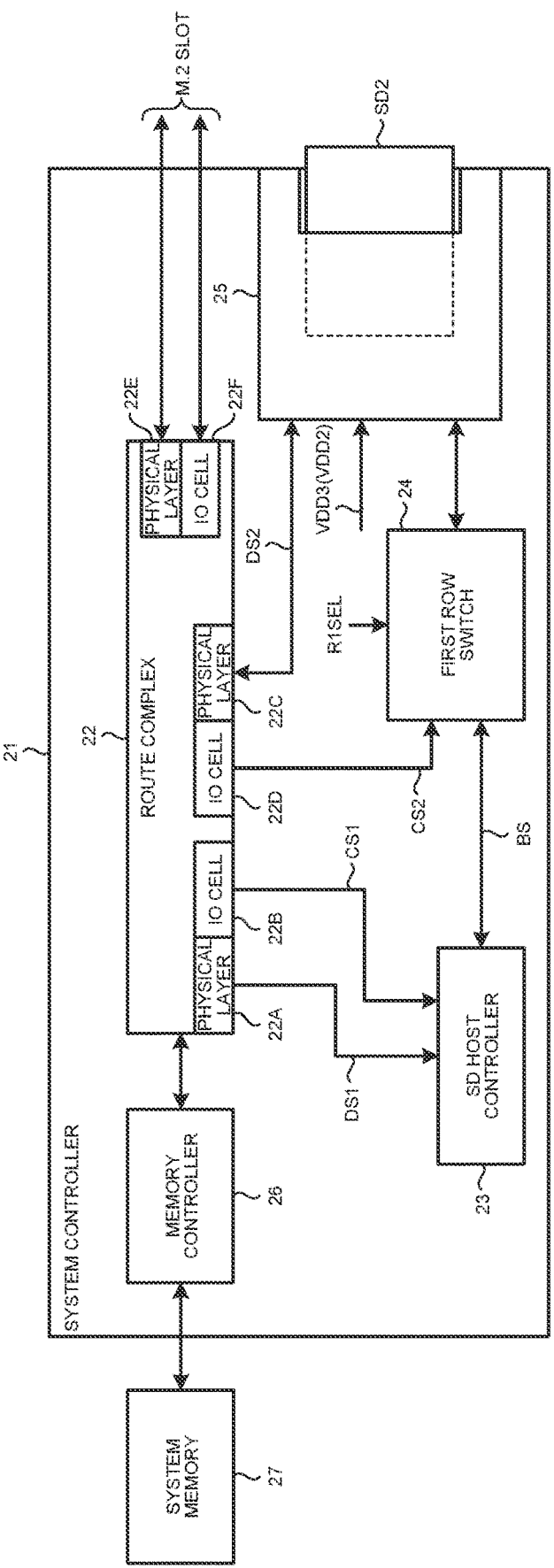
FIG. 6 is a block diagram schematically illustrating the configuration of a host device to which a memory card is attached, according to a seventh embodiment.

FIG. 6 is a block diagram schematically illustrating the configuration of a host device to which a memory card is attached, according to a seventh embodiment.

In FIG. 6, a system controller 21 and a system memory 27 are provided in the host device. A route complex 22, an SD host controller 23, a first row switch 24, a connector 25, and a memory controller 26 are provided in the system controller 21. The memory controller 26 is connected to the system memory 27.

The route complex 22 can control access to the system memory by mediating between a plurality of PCIe lanes and can mediate data transfer between devices connected to PCIe lanes and the system memory. If the route complex 22 has a plurality of PCIe lanes, the route complex 22 and a plurality of PCIe devices (including memory cards) can form a star-star connection. A plurality of lanes can be assigned to one device. The SD host controller 23 can be used when the memory card SD2 is controlled in the first mode compliant with the SD standard. The first row switch 24 can switch the use of the row R1 between in communication in the first mode compliant with the SD standard and in communication in the second mode compliant with the PCIe standard based on a selection signal R1SEL.

The connector 25 can be in contact with the memory card SD2. At this time, the form factor of the connector 25 can be made to correspond to that of the microSD card. Connector contact terminal groups corresponding to the card terminal groups of the memory card SD2 can be provided in the connector 25 so as to be in contact with the memory card SD2. The card terminal groups of the memory card SD2 are the terminal groups PA1 to PA4 of FIG. 2. Further, the connector 25 has connector terminal groups via which to connect to the host controller. In the description below, in order to distinguish between the terminal groups provided on the memory card and the terminal groups provided in the connector, the terminal groups provided on the memory card may be called card terminal groups, and the terminal groups provided in the connector may be called connector terminal groups.

The power supply voltage VDD3 is applied to the connector 25, and if the power supply voltage VDD3 is not applied, the power supply voltage VDD2 is applied. The memory controller 26 can control the operation of the system memory 27.

Physical layer interfaces 22A, 22C, 22E and IO cells 22B, 22D, 22F are provided in the route complex 22. Each physical layer interface 22A, 22C, 22E is a differential signal interface of the PCIe standard, and the IO cells 22B, 22D, 22F are interfaces for single-ended signals and a differential reference clock of the PCIe standard.

The physical layer interface 22A and the IO cell 22B are connected to the SD host controller 23. In this case, the route complex 22 can communicate with the SD host controller 23 with use of a differential signal DS1 and a control signal CS1. The physical layer interface 22C is connected to the connector 25. The IO cell 22D is connected to the first row switch 24. The physical layer interface 22E and the IO cell 22F are connected to an M.2 slot. The M.2 slot supports Serial Advanced Technology Attachment (SATA) and the PCIe standard, and various PCIe devices can be connected thereto. The SD host controller 23 is connected to the connector 25 via the first row switch 24.

When communication in the first mode compliant with the SD standard is selected by the selection signal R1SEL, the first row switch 24 switches the use of the row R1 of the memory card SD2 to the SD host controller 23 side. Then an SD bus signal BS outputted from the SD host controller 23 is assigned to the row R1, and the SD host controller 23 and the memory card SD2 communicate in the first mode compliant with the SD standard. The SD bus signal BS can include the command CMD, clock CLK, and data DAT[3:0].

When communication in the second mode compliant with the PCIe standard is selected by the selection signal R1SEL, the first row switch 24 switches the use of the row R1 of the memory card SD2 to the IO cell 22D side. Then a control signal CS2 is assigned to the row R1. This control signal CS2 can include the reference differential clock signals REFCLKp/n, reset signal PERST, power management control signal CLKREQ, and wakeup signal PEWAKE. Further, this control signal CS2 can also include the wakeup signal PEWAKE.

A differential signal DS2 is transmitted and received between the physical layer interface 22C and the rows R3, R4 of the memory card SD2. This differential signal DS2 can include the receive differential signals RX0P, RX0N, RX1P, RX1N and the transmit differential signals TX0P, TX0N, TX1P, TX1N. Thus, the route complex 22 and the memory card SD2 can communicate in the second mode compliant with the PCIe standard.

As to how to set the selection signal R1SEL, it can be set according to whether the power supply voltage VDD2 or the power supply voltage VDD3 is applied or not. It is possible to control the state of duration of initialization by detecting variation point (i.e. variation point from off state to on state, or variation point from on state to off state) of the power supply voltage VDD2 or the power supply voltage VDD3. Or a register may be provided in the system controller 21 or the like, and the selection signal R1SEL may be set based on the value stored in this register. By setting the selection signal R1SEL based on the value stored in this register, communication can be switched between the first mode compliant with the SD standard and the second mode compliant with the PCIe standard regardless of whether the power supply voltage VDD3 is used or not.

It should be noted that, although the embodiment of FIG. 6 illustrates a configuration where the connector 25 to which the memory card SD2 is attachable is mounted on the host device, a connector to which the memory card SD1, SD3 to SD5 is attachable may be mounted on the host device. The form factor of the connector to which the memory card SD1, SD3 is attachable can be made to correspond to that of the microSD card. The form factor of the connector to which the memory card SD4 is attachable encompasses the form factor corresponding to the microSD card and can be encompassed by the form factor corresponding to the standard-size SD card. The form factor of the connector to which the memory card SD5 is attachable can be made to correspond to that of the standard-size SD card and encompasses the form factor corresponding to the microSD card and the form factor of the card SD4.

Eighth Embodiment

Figure 7:
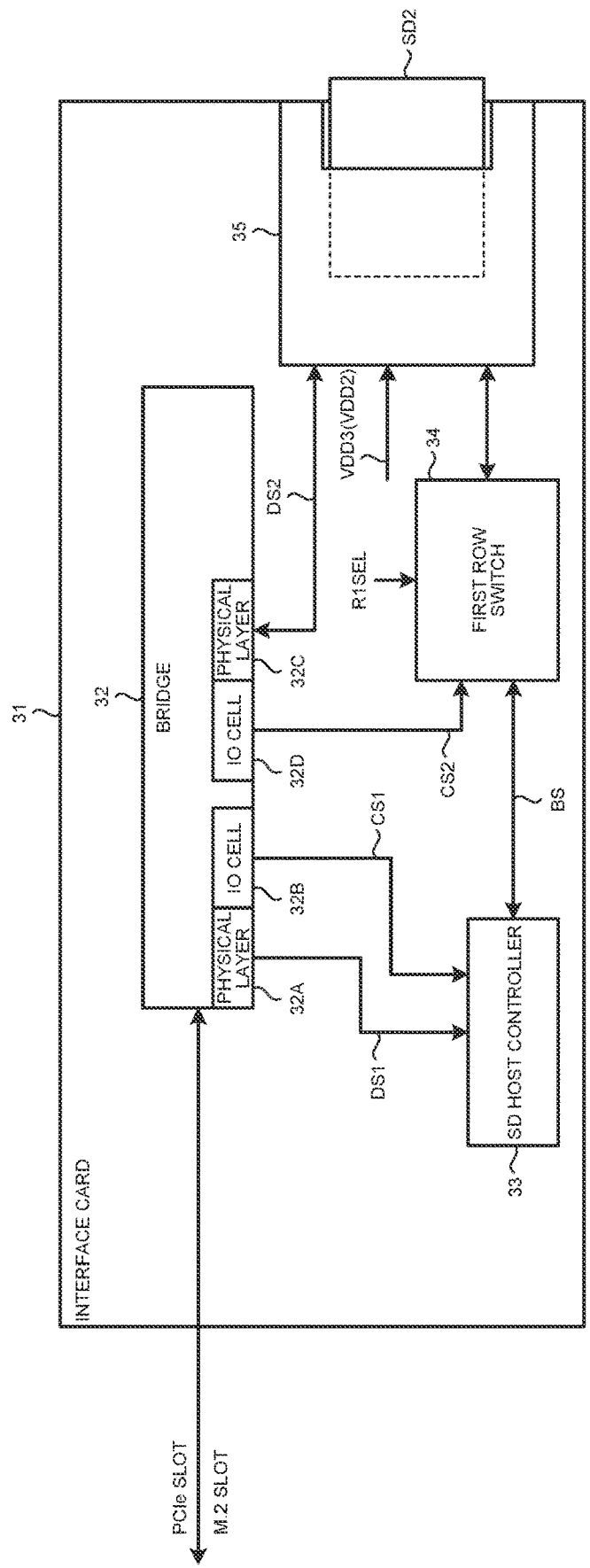
FIG. 7 is a block diagram schematically illustrating the configuration of an interface card to which a memory card is attached, according to an eighth embodiment.

FIG. 7 is a block diagram schematically illustrating the configuration of an interface card to which a memory card is attached, according to an eighth embodiment.

In FIG. 7, a bridge 32, an SD host controller 33, a first row switch 34, and a connector 35 are provided in the interface card 31.

By attaching the interface card 31 to the PCIe slot or the M.2 slot, the bridge 32 can switch communication to the second mode compliant with the PCIe standard. The SD host controller 33, first row switch 34, and connector 35 can be configured in the same way as the SD host controller 23, first row switch 24, and connector 25 of FIG. 6.

Physical layer interfaces 32A, 32C and IO cells 32B, 32D are provided in the bridge 32. Each physical layer interface 32A, 32C can interface differential signals of the PCIe standard. The IO cells 32B, 32D can interface single-ended signals and a differential reference clock of the PCIe standard.

The physical layer interface 32A and the IO cell 32B are connected to the SD host controller 33. In this case, the bridge 32 can communicate with the SD host controller 33 with use of a differential signal DS1 and a control signal CS1. The physical layer interface 32C is connected to the connector 35. The IO cell 32D is connected to the first row switch 34.

When communication in the first mode compliant with the SD standard is selected by the selection signal R1SEL, the first row switch 34 switches the use of the row R1 of the memory card SD2 to the SD host controller 33 side. Then an SD bus signal BS outputted from the SD host controller 33 is assigned to the row R1, and the SD host controller 33 and the memory card SD2 communicate in the first mode compliant with the SD standard.

When communication in the second mode compliant with the PCIe standard is selected by the selection signal R1SEL, the first row switch 34 switches the use of the row R1 of the memory card SD2 to the IO cell 32D side. Then a control signal CS2 is assigned to the row R1. A differential signal DS2 is transmitted and received between the physical layer interface 32C and the rows R3, R4 of the memory card SD2. Then the bridge 32 and the memory card SD2 communicate in the second mode compliant with the PCIe standard.

Ninth Embodiment

Figure 8:
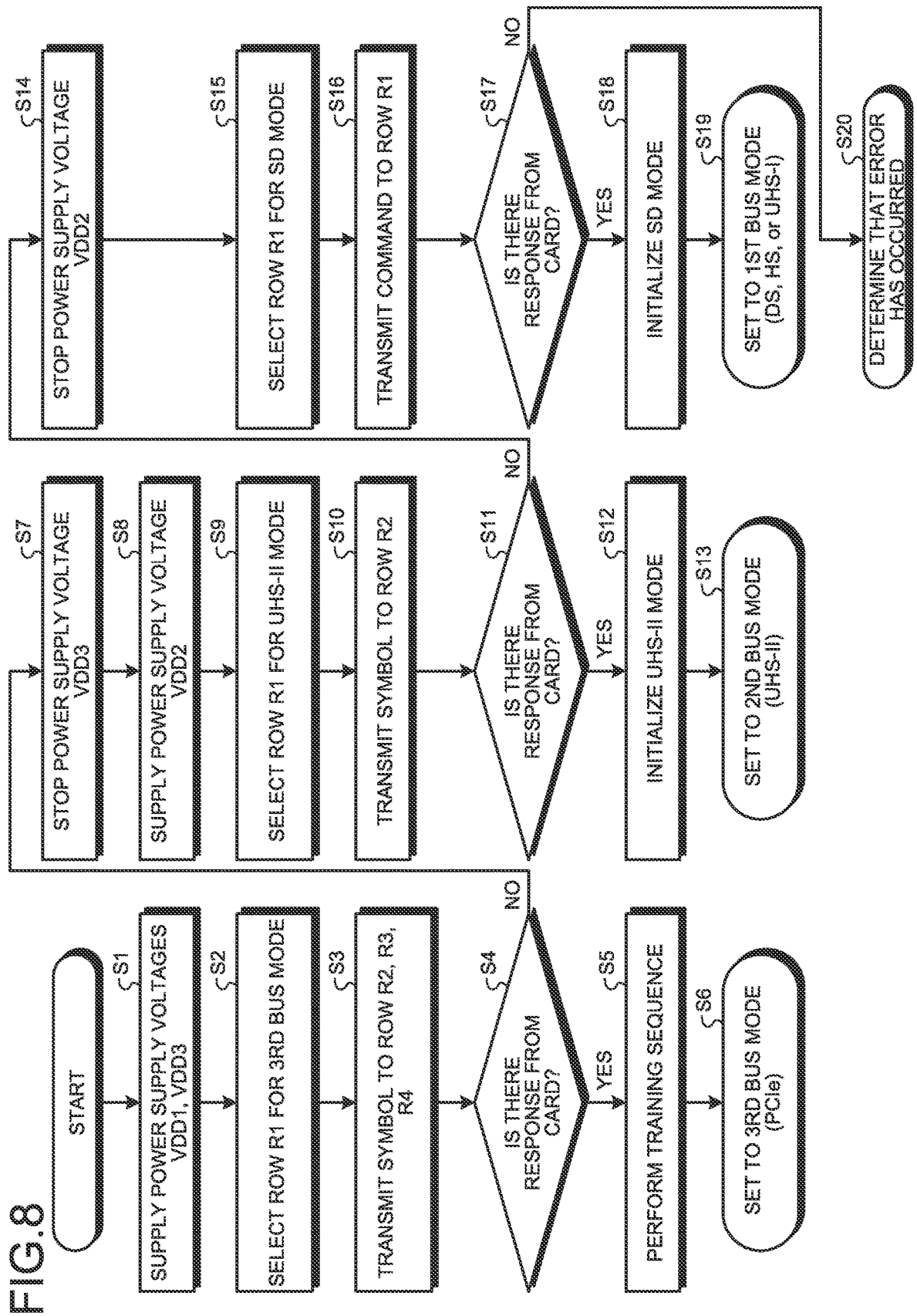
FIG. 8 is a flow chart illustrating the operation of a host device when setting the bus mode of a memory card, according to a ninth embodiment.

FIG. 8 is a flow chart illustrating the operation of the host device when setting the bus mode of a memory card, according to a ninth embodiment. The method of setting the bus mode of the memory card can be used in any memory card SD1 to SD5 shown in FIGS. 1, 2, and 3A to 3C.

In FIG. 8, the host device supplies the power supply voltages VDD1, VDD3 to the memory card (S1). The power supply voltage VDD1 can be supplied to the power supply terminal VDD of the row R1 of the memory card. If only the rows R1, R2 are on the memory card as shown in FIG. 1, the power supply voltage VDD3 can be supplied to the power supply terminal VDD3 or, if there is no power supply voltage VDD3, the power supply terminal VDD2 of the row R2 of the memory card. As shown in FIG. 2 or FIGS. 3A to 3C, if the row R3 is on the memory card, the power supply voltage VDD3 can be supplied to the power supply terminal VDD3 of the row R3 of the memory card.

If the power supply terminal VDD3 is not supported (not shown), instead the power supply terminal VDD2 is supplied to the power supply terminal VDD2.

In this case, the host device can detect whether a card is attached by monitoring the rise times of voltages on terminals of the rows R3, R4 to which the transmit differential signals TX0P, TX0N, TX1P, TX1N are assigned. The host device and a card are connected via AC coupling capacitors, and only when the card is attached, charge current flows through the capacitors. Thus, when a memory card is attached to the host device, the rise time is longer than when a memory card is not attached to the host device. Thus, it can be determined whether a memory card is attached to the host device based on this rise time. If there are a plurality of lanes, it can also be determined which lane is usable for communication. And when a memory card is attached to the host device, the host device can start communicating with the memory card.

Then the host device selects the row R1 for a third bus mode (S2). The third bus mode is communication in the second mode compliant with the PCIe standard.

Then the host device transmits a symbol to identify whether the memory card supports the PCIe standard to the row R2, R3, or R4 (S3).

Then if a response to the symbol of S3 is transmitted from the memory card within a prescribed time (Yes at S4), the host device performs a training sequence (S5). This training sequence can determine an operation frequency of maximum performance supported by both the memory card and the host device.

Then the host device sets the method of communication with the memory card to the third bus mode (S6).

On the other hand, if a response to the symbol of S3 has not been transmitted from the memory card within the prescribed time (No at S4), the host device stops supplying the power supply voltage VDD3 (S7) and supplies the power supply voltage VDD2 to the memory card (S8). The power supply voltage VDD2 can be supplied to the power supply terminal VDD2 of the row R2 of the memory card.

Then the host device selects the row R1 as control terminals for a UHS-II mode (S9). Specifically, a differential reference clock is assigned to two terminals.

Then the host device transmits a symbol to identify whether the memory card supports the UHS-II to the row R2 (S10).

Then if a response to the symbol of S10 is transmitted from the memory card within a prescribed time (Yes at S11), the host device initializes the UHS-II mode (S12). In this initialization of the UHS-II mode, an operation frequency of maximum performance supported by both the memory card and the host device can be determined.

Then the host device sets the method of communication with the memory card to a second bus mode (313). The second bus mode is communication according to the UHS-II.

On the other hand, if a response to the symbol of S10 has not been transmitted from the memory card within the prescribed time (No at S11), the host device stops supplying the power supply voltage VDD2 (S14). Whether to stop supplying the power supply voltage VDD2 can be optional.

Then the host device selects the row R1 as signal terminals for the first mode compliant with the SD standard (S15).

Then the host device transmits a command to initialize the first mode compliant with the SD standard to the row R1 (S16).

Then if a response to the command of S16 is transmitted from the memory card within a prescribed time (Yes at S17), the host device initializes the first mode compliant with the SD standard (S18). In this initialization of the first mode compliant with the SD standard, an SD bus mode and operation frequency of maximum performance supported by both the memory card and the host device can be determined.

Then the host device sets the method of communication with the memory card to a first bus mode (S19). The first bus mode is communication in the first mode compliant with the SD standard.

On the other hand, if a response to the command of S16 has not been transmitted from the memory card within the prescribed time (No at S17), the host device determines that an error has occurred and stops the initialization of the first mode compliant with the SD standard (S20). S20 includes cases where a card that is not an SD card is connected.

For example, suppose that the process of FIG. 8 is applied to the memory card SD1 of FIG. 1. In this case, the power supply voltage VDD3 is supplied to the power supply terminal VDD3 of the row R2 of the memory card SD1 (S1). If the memory card SD1 supports the PCIe standard, when a symbol is transmitted to the row R2 of the memory card SD1 (S3), then there is a response from the memory card SD1 (Yes at S4). Thus, the host device sets the method of communication with the memory card SD1 to the second mode compliant with the PCIe standard (S6).

In contrast, if the memory card SD1 supports the UHS-II, when a symbol is transmitted to the row R2 of the memory card SD1 (S3), then there is no response from the memory card SD1 (No at S4). Thus, supplying the power supply voltage VDD3 to the power supply terminal VDD3 of the row R2 of the memory card SD1 is stopped (S7), and the power supply voltage VDD2 is supplied to the power supply terminal VDD2 of the row R2 of the memory card SD1 (S8). Then when a symbol is transmitted to the row R2 of the memory card SD1 (S10), then there is a response from the memory card SD1 (Yes at S11). Thus, the host device sets the method of communication with the memory card SD1 to the UHS-II (S13).

In contrast, if the memory card SD1 does not support the UHS-II, when a symbol is transmitted to the row R2 of the memory card SD1 (S10), then there is no response from the memory card SD1 (No at S11). Then when a command is transmitted to the row R1 of the memory card SD1 (S16), then if there is a response from the memory card SD1, the host device sets the method of communication with the memory card SD1 to the first mode compliant with the SD standard (S19).

As another example, suppose that the process of FIG. 8 is applied to the memory card SD3 of FIG. 4A. In this case, the power supply voltage VDD3 is supplied to the power supply terminal VDD3 of the row R3 of the memory card SD3 (S1). Since the memory card SD3 supports the PCIe standard, when a symbol is transmitted to the row R3 of the memory card SD3 (S3), then there is a response from the memory card SD3 (Yes at S4). Thus, the host device sets the method of communication with the memory card SD1 to the second mode compliant with the PCIe standard (S6).

In contrast, if the memory card SD3 is made to operate in the first mode compliant with the SD standard, the power supply voltage VDD3 is made to be not supplied to the power supply terminal VDD3 of the row R3 of the memory card SD3. In this case, when a symbol is transmitted to the row R3 of the memory card SD3 (S3), then there is no response from the memory card SD3 (No at S4). Because the memory card SD3 does not have the row R2, when a symbol is transmitted toward the row R2 of the memory card SD3 (S10), then there is no response from the memory card SD3 (No at S11). Since the memory card SD3 supports the SD standard, when a command is transmitted to the row R1 of the memory card SD3 (S16), then there is a response from the memory card SD3 (Yes at S17). Thus, the host device sets the method of communication with the memory card SD3 to the first mode compliant with the SD standard (S19).

Tenth Embodiment

Figure 9:
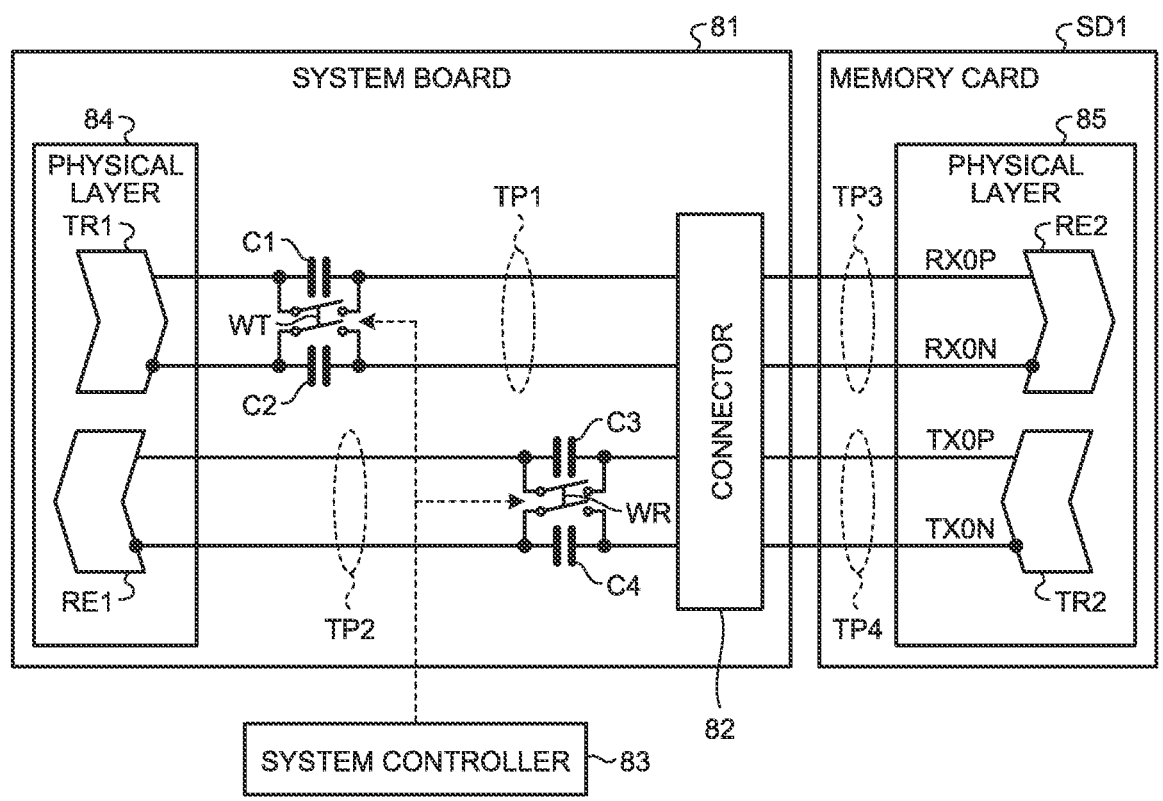
FIG. 9 is a block diagram illustrating the method of incorporating AC coupling capacitors in differential transmission paths to be connected to a memory card, according to a tenth embodiment.

FIG. 9 is a block diagram illustrating the method of incorporating AC coupling capacitors in differential transmission paths to be connected to a memory card, according to a tenth embodiment.

In FIG. 9, a system board 81 and a system controller 83 are provided in the host device. A connector 82 and a physical layer interface 84 are provided in the system board 81. A receiver RE1 and a transmitter TR1 are provided in the physical layer interface 84. Transmit differential signals TX0P, TX0N transmitted through the row R2 of the memory card SD1 can be inputted to the receiver RE1. The transmitter TR1 can output receive differential signals RX0P, RX0N to be received at the row R2 of the memory card SD1.

The transmitter TR1 and the connector 82 are connected via a differential transmission path TP1. In this case, the differential transmission path TP1 can connect the transmitter TR1 and the connector 82 via AC coupling capacitors C1, C2. A switch WT is connected in shunt with the AC coupling capacitors C1, C2. The switch WT can short-circuit the AC coupling capacitors C1, C2. The incorporation of the switch WT can be optional.

The receiver RE1 and the connector 82 are connected via a differential transmission path TP2. In this case, the differential transmission path TP2 can connect the receiver RE1 and the connector 82 via AC coupling capacitors C3, C4. A switch WR is connected in shunt with the AC coupling capacitors C3, C4. The switch WR can short-circuit the AC coupling capacitors C3, C4. The incorporation of the switch WR can be optional.

A physical layer interface 85 is provided in the memory card SD1. The physical layer interface 85 can support only one of the UHS-II standard and the PCIe standard. A receiver RE2 and a transmitter TR2 are provided in the physical layer interface 85. The receive differential signals RX0P, RX0N received at the row R2 of the memory card SD1 can be inputted to the receiver RE2. The transmitter TR2 can output the transmit differential signals TX0P, TX0N to be transmitted through the row R2 of the memory card SD1.

The receiver RE2 is connected to a differential transmission path TP3. The transmitter TR2 is connected to a differential transmission path TP4. By attaching the memory card SD1 to the connector 82, the differential transmission paths TP1, TP3 can be connected to each other, and in addition the differential transmission paths TP2, TP4 can be connected to each other.

If the memory card SD1 supports the UHS-II standard, the system controller 83 can turn on the switches WT, WR to short-circuit the AC coupling capacitors C1 to C4.

In contrast, if the memory card SD1 supports the PCIe standard, the system controller 83 can turn off the switches WT, WR so that the physical layer interfaces 84, 85 are separated in terms of direct current.

Thus, without replacing the system board 81 between when the memory card SD1 supports the UHS-II standard and when the memory card SD1 supports the PCIe standard, the system board 81 can deal with both the cases where the memory card SD1 supports the UHS-II standard and where it supports the PCIe standard.

It should be note that, in the second mode compliant with the PCIe standard, by connecting the physical layer interfaces 84, 85 via the AC coupling capacitors C1 to C4, the transmit side and receive side of differential signals can be separated in terms of direct current, so that the common voltage level of the physical layer interface 84, 85 can be designed independently for the transmit side and receive side (not affected by each other). In contrast, in the case of DC coupling without AC coupling capacitors, because fluctuation in the ground level affects signal voltages of both sides, designing to suppress fluctuation in the ground level is needed.

The AC coupling capacitors need to have a capacitance of about 200 nF, so that, because of their size, it is difficult to mount them in the microSD form factor. Accordingly, by providing the AC coupling capacitors C1 to C4 on the system board 81, the need to provide the AC coupling capacitors C3, C4 in the memory card SD1 is eliminated, so that the manufacture of a thin memory card SD1 can be made easier.

Eleventh Embodiment

Figure 10A:
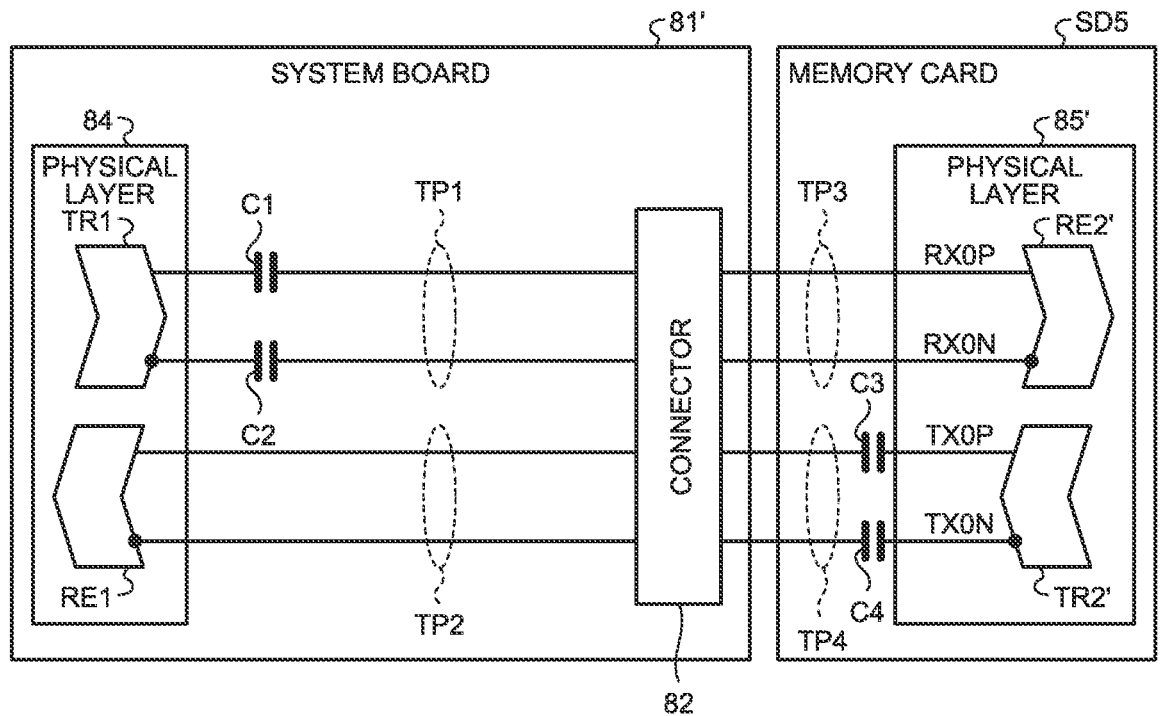
FIG. 10A is a block diagram illustrating the method of incorporating AC coupling capacitors in differential transmission paths to be connected to a memory card, according to an eleventh embodiment.

FIG. 10A is a block diagram illustrating the method of incorporating AC coupling capacitors in differential transmission paths to be connected to a memory card, according to an eleventh embodiment.

In FIG. 10A, a system board 81' is provided in the host device. A connector 82 and a physical layer interface 84 are provided in the system board 81'. A receiver RE1 and a transmitter TR1 are provided in the physical layer interface 84.

The transmitter TR1 and a differential transmission path TP1 leading from the connector 82 are connected via AC coupling capacitors C1, C2.

The receiver RE1 and the connector 82 are connected via a differential transmission path TP2. In this case, the differential transmission path TP2 can directly connect the receiver RE1 and the connector 82.

A physical layer interface 85' is provided in the memory card SD5. The physical layer interface 85' can support the PCIe standard. A receiver RE2' and a transmitter TR2' are provided in the physical layer interface 85'. The receive differential signals RX0P, RX0N received at the row R3 of the memory card SD5 can be inputted to the receiver RE2'. The transmitter TR2' can output the transmit differential signals TX0P, TX0N to be transmitted through the row R3 of the memory card SD5.

The receiver RE2' is connected to a differential transmission path TP3. The case where the transmitter TR2' and a differential transmission path TP4 are connected via AC coupling capacitors C3, C4 is shown. This is a common incorporating method for a PCIe device.

However, the capacitance range of the AC coupling capacitors is determined, and there is the problem that it is too large to be mounted in the microSD form factor. That is, the configuration of FIG. 10A is not suitable for application to a small removable card having a form factor with a small thickness.

Twelfth Embodiment

Figure 10B:
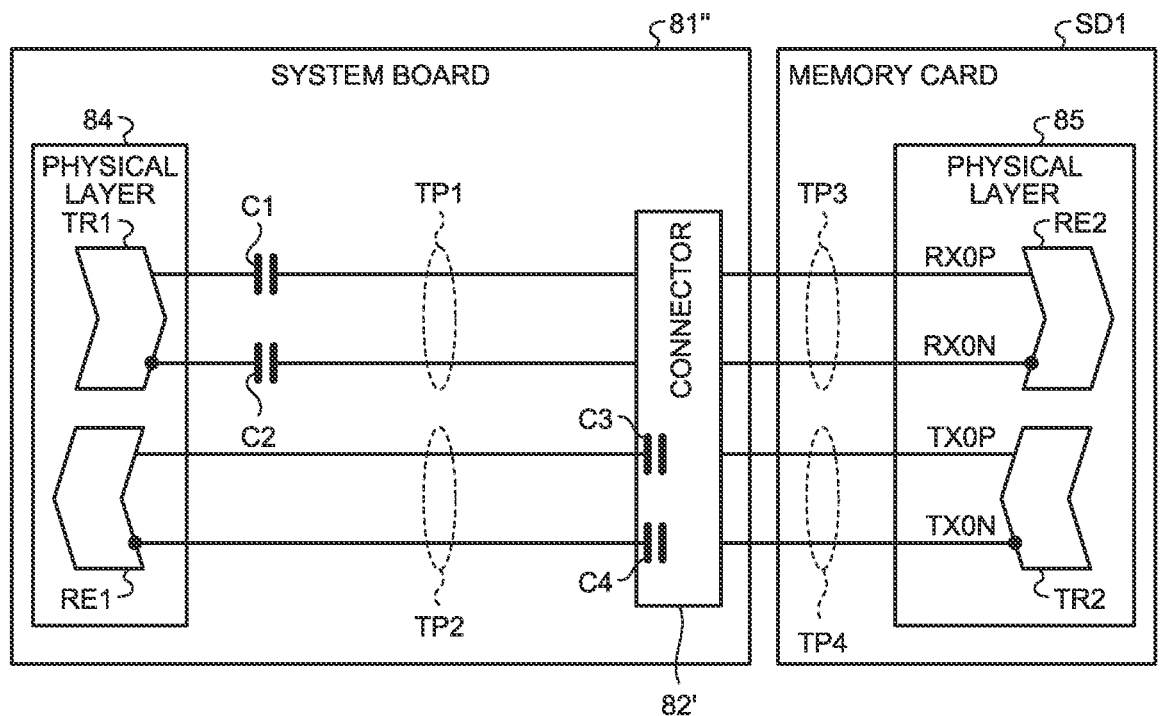
FIG. 10B is a block diagram illustrating the method of incorporating AC coupling capacitors in differential transmission paths to be connected to a memory card, according to a twelfth embodiment.

FIG. 10B is a block diagram illustrating the method of incorporating AC coupling capacitors in differential transmission paths to be connected to a memory card, according to a twelfth embodiment.

In FIG. 10B, a system board 81" is provided in the host device. A connector 82' and a physical layer interface 84 are provided in the system board 81". A receiver RE1 and a transmitter TR1 are provided in the physical layer interface 84. AC coupling capacitors C3, C4 are provided in the connector 82'. The AC coupling capacitors C3, C4 can be electrically inserted between connector terminals connectable to the memory card SD1 side and connection terminals to be connected to the physical layer interface 84 of the host device, in the connector 82'.

The transmitter TR1 and a differential transmission path TP1 leading from the connector 82' are connected via AC coupling capacitors C1, C2. The AC coupling capacitors C1, C2 may be placed inside the connector 82', so that the area to place the C1, C2 on the PCB need not be secured.

The receiver RE1 and the connector 82' are connected via a differential transmission path TP2. In this case, the differential transmission path TP2 can directly connect the receiver RE1 and the connector 82'. The differential transmission path TP2 on the host device side and a differential transmission path TP4 on the card side are connected via the AC coupling capacitors C3, C4 in the connector 82'.

Although FIG. 10B is a diagram illustrating the case where the AC coupling capacitors C3, C4 are provided in the connector, the AC coupling capacitors C3, C4 may be inserted between the receiver RE1 and the differential transmission path TP2 leading from the connector 82', not placed in the connector. In this case, the area to place the AC coupling capacitors C3, C4 on the printed circuit board (PCB) needs to be secured.

By attaching the memory card SD1 to the connector 82', the differential transmission path (on the transmit side of the host device) TP1 and the differential transmission path (on the receive side of the memory card SD1) TP3 can be connected to each other, and in addition the differential transmission path (on the receive side of the host device) TP2 and the differential transmission path (on the transmit side of the memory card SD1) TP4 can be connected to each other via the AC coupling capacitors C3, C4.

Since the AC coupling capacitors C3, C4 are provided in the connector 82', the AC coupling capacitors C3, C4 need not be provided in the memory card SD1, so that a small removable card having a form factor with a small thickness like a microSD memory card can be dealt with. Of course, the incorporating method can be applied to larger form factors.

Thirteenth Embodiment

Figure 11A:
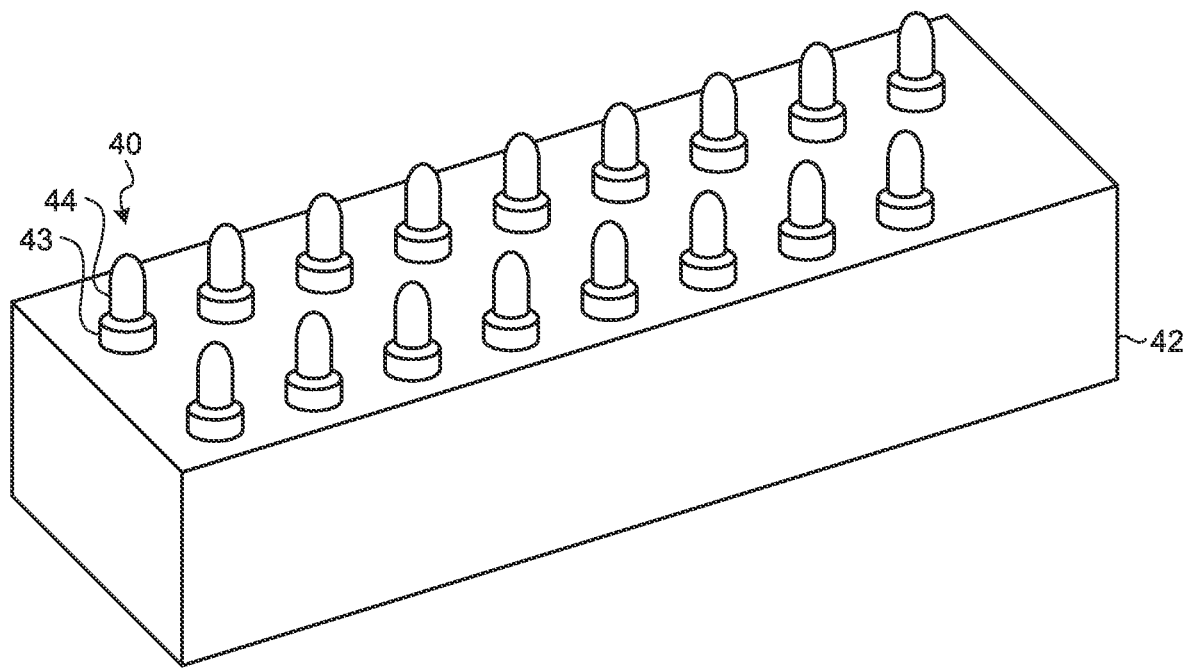
FIG. 11A is a perspective view schematically illustrating an example configuration of a connector used for a memory card according to a thirteenth embodiment.
Figure 11B:
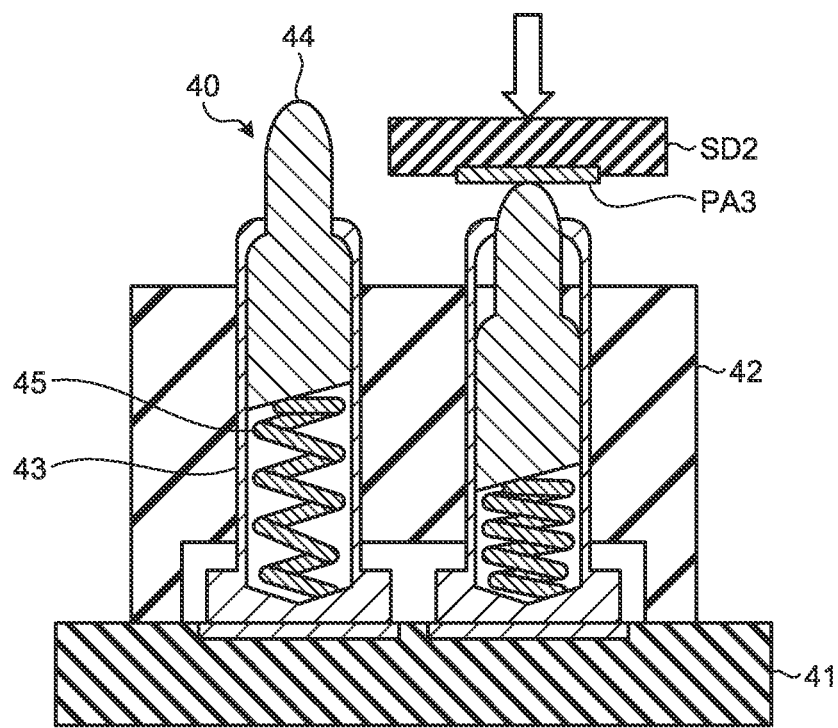
FIG. 11B is a cross-sectional view schematically illustrating the example configuration of the connector used for the memory card according to the thirteenth embodiment.

FIG. 11A is a perspective view schematically illustrating an example configuration of a connector used for a memory card according to a thirteenth embodiment. FIG. 11B is a cross-sectional view schematically illustrating the example configuration of the connector used for the memory card according to the thirteenth embodiment. FIG. 11B shows two docking pins in FIG. 11A.

In FIG. 11A, this connector can be used to be in contact with the terminal groups PA3 to PC3, PA4 to PC4 of the rows R3, R4 of the memory cards SD2 to SD5. Docking pins 40 are provided in this connector. The docking pins 40 can be arranged correspondingly to the terminal arrangement of the rows R3, R4.

As shown in FIG. 11B, a pin 44 is provided in the docking pin 40. The pin 44 is accommodated in a cylinder 43. A spring 45 is provided at the bottom of the pin 44 in the cylinder 43, and the pin 44 is supported via the spring 45 to be vertically movable. The docking pin 40 is supported standing upright in a housing 42. The housing 42 can be installed on a base 41.

For example, when the connector is in contact with the row R3 of the memory cards SD2, each terminal of the terminal group PA3 of the memory cards SD2 is pushed against the tip of a pin 44. At this time, since the pin 44 is pushed down, the spring 45 pushes back the pin 44 upward. Thus, the pin 44 can be firmly fastened by pressure to the terminal, so that impact resistance can be improved. As a result, if the memory card SD2 is used in an environment where severe vibration or impact is applied such as a vehicle or a drone, the memory card SD2 can be prevented from becoming unstable in operation.

Fourteenth Embodiment

Figure 12A:
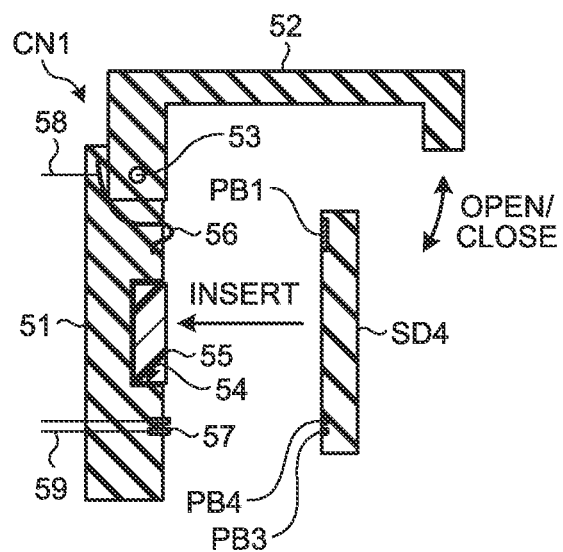
FIG. 12A is a cross-sectional view schematically illustrating an example configuration of a connector before a memory card is attached, according to a fourteenth embodiment.
Figure 12B:
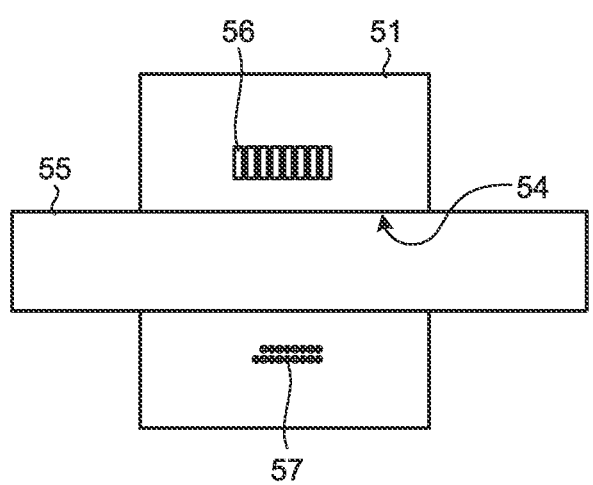
FIG. 12B is a plan view schematically illustrating the example configuration of the connector before the memory card is attached, according to the fourteenth embodiment.
Figure 12C:
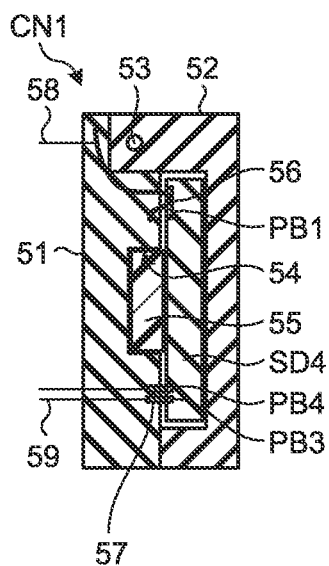
FIG. 12C is a cross-sectional view schematically illustrating an example configuration of the connector after the memory card is attached, according to the fourteenth embodiment.
Figure 12D:
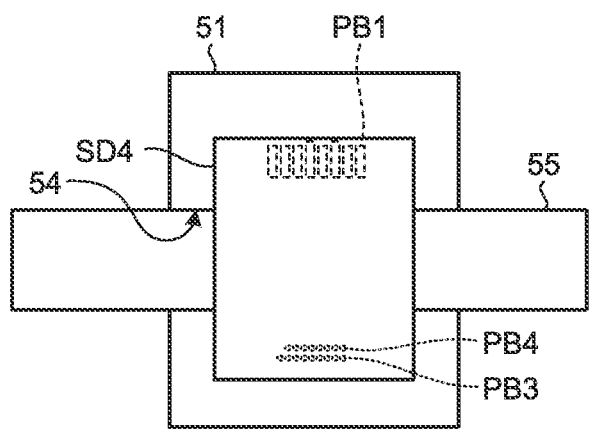
FIG. 12D is a plan view schematically illustrating the example configuration of the connector after the memory card is attached, according to the fourteenth embodiment.

FIG. 12A is a cross-sectional view schematically illustrating an example configuration of a connector before a memory card is attached, according to a fourteenth embodiment. FIG. 12B is a plan view schematically illustrating the example configuration of the connector before the memory card is attached, according to the fourteenth embodiment. FIG. 12C is a cross-sectional view schematically illustrating an example configuration of the connector after the memory card is attached, according to the fourteenth embodiment. FIG. 12D is a plan view schematically illustrating the example configuration of the connector after the memory card is attached, according to the fourteenth embodiment.

Note that FIGS. 11B and 11D show the state where the cover of the connector is removed. This embodiment takes as an example a connector to be in contact with the memory card SD4 of FIG. 4B.

In FIGS. 11A and 11B, the connector CN1 has a base 51 and a cover 52 provided. An end of the base 51 and an end of the cover 52 are coupled by a pin 53. By rotating the cover 52 with the pin 53 as the rotation axis, the cover 52 can be opened and closed.

A recess 54 is provided extending transversely in the center of the base 51. A radiating sheet 55 is placed in the recess 54. The radiating sheet 55 can be formed of flexible material high in heat conductivity. For example, acrylic resin can be used as the material of the radiating sheet 55. The radiating sheet 55 can be set to have such a size as to extend laterally out from the base 51. The parts of the radiating sheet 55 extending laterally out from the base 51 can be made in contact with the surface on which the connector CN1 is installed. The installation surface of the connector CN1 is, for example, the casing of the host device.

The base 51 has a connector row R1 terminal group 58 and a connector row R3/R4 terminal group 59, which are to connect to the host side, and a connector row R1 contact group and a connector row R3/R4 contact group, which protrude from the surface of the base 51 so as to connect to the card side and have lead pins 56 and docking pins 57 embedded. The lead pins 56 can be arranged correspondingly to the terminal arrangement of the row R1 of the memory card SD4. The docking pins 57 can be arranged correspondingly to the terminal arrangements of the rows R3, R4 of the memory card SD4. The connector row R1 contact group of the lead pins 56 is wired to the connector row R1 terminal group 58 to be able to connect to the host device. The connector row R3/R4 contact group of the docking pins 57 is wired to the connector row R3/R4 terminal group 59 to be able to connect to the host device.

When the memory card SD4 is attached to the connector CN1, the memory card SD4 is mounted on the base 51 with the cover 52 open. Then by closing the cover 52, the memory card SD4 can be fixed to the connector CN1.

At this time, as shown in FIGS. 11C and 11D, the terminal group PB1 of the row R1 of the memory card SD4 can be fastened by pressure to the lead pins 56, and the terminal groups PB3, PB4 of the rows R3, R4 of the memory card SD4 can be fastened by pressure to the docking pins 57. Empty space between the row R1 and the rows R3, R4 on the card surface of the memory card SD4 can be fastened by pressure to the radiating sheet 55.

By using the docking pins 57 to be in contact with the terminal groups PB3, PB4 of the rows R3, R4 of the memory card SD4, a lateral offset between the terminal groups PB3, PB4 and the docking pins 57 when in contact, can be reduced. Thus, the terminal groups PB3, PB4 and the docking pins 57 can be reliably made in contact, accommodating to reduction in the size of the terminals of the terminal groups PB3, PB4.

By providing the radiating sheet 55 in the connector CN1, heat generated in the memory card SD4 can be efficiently released to the host device via the radiating sheet 55, so that the heat dissipation of the memory card SD4 can be improved.

It should be noted that, although the method that places the radiating sheet 55 in the recess 54 in the base 51 is described in the above embodiment, instead of the radiating sheet 55, a Peltier device may be placed in the recess 54 in the base 51. By using a Peltier device, the memory card SD4 can be cooled forcedly.

Fifteenth Embodiment

Figure 13A:
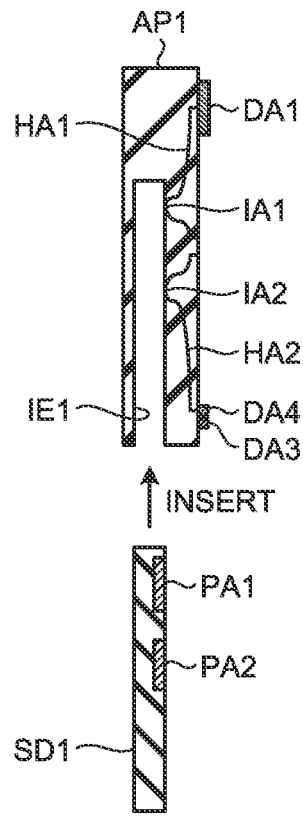
FIG. 13A is a cross-sectional view schematically illustrating an example configuration of an adapter before a memory card is attached, according to a fifteenth embodiment.
Figure 13B:
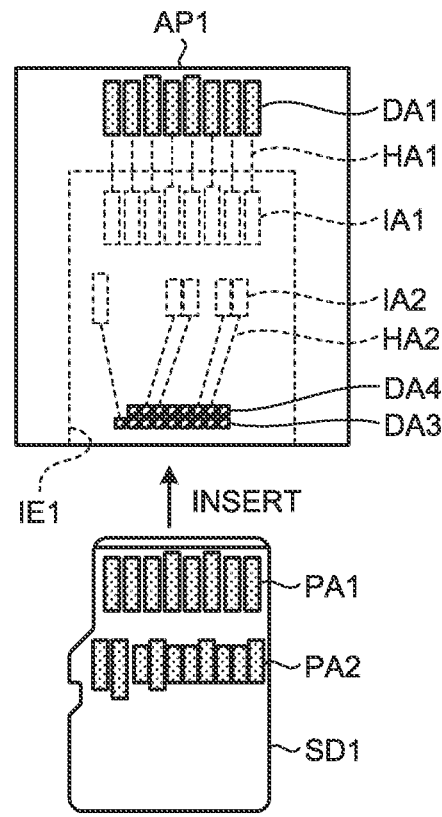
FIG. 13B is a plan view schematically illustrating the example configuration of the adapter before the memory card is attached, according to the fifteenth embodiment.
Figure 13C:
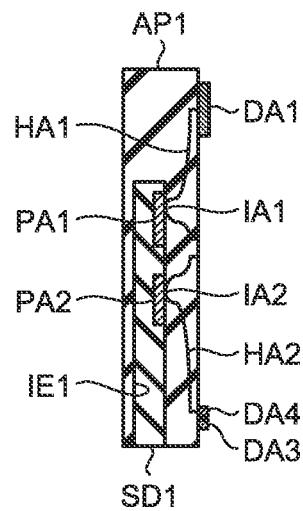
FIG. 13C is a cross-sectional view schematically illustrating an example configuration of the adapter after the memory card is attached, according to the fifteenth embodiment.
Figure 13D:
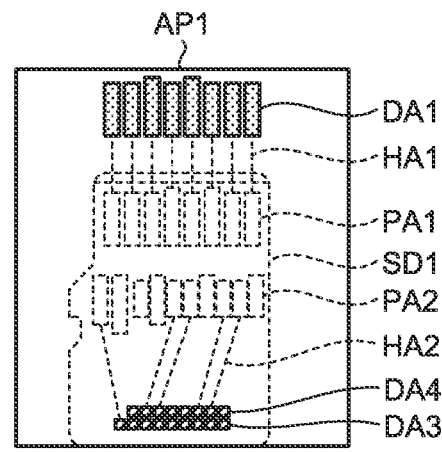
FIG. 13D is a plan view schematically illustrating the example configuration of the adapter after the memory card is attached, according to the fifteenth embodiment.

FIG. 13A is a cross-sectional view schematically illustrating an example configuration of an adapter before a memory card is attached, according to a fifteenth embodiment. FIG. 13B is a plan view schematically illustrating the example configuration of the adapter before the memory card is attached, according to the fifteenth embodiment. FIG. 13C is a cross-sectional view schematically illustrating an example configuration of the adapter after the memory card is attached, according to the fifteenth embodiment. FIG. 13D is a plan view schematically illustrating the example configuration of the adapter after the memory card is attached, according to the fifteenth embodiment.

It should be noted that this embodiment illustrates the adapter that converts the form factor of the memory card SD1 of FIG. 1 to the form factor of the memory card SD4 of FIG. 4B.

In FIGS. 12A and 12B, an inserting portion IE1 through which the memory card SD1 is to be inserted into the adapter AP1 is provided in the adapter AP1. The inlet to the inserting portion IE1 can be provided at the back end of the adapter AP1.

A terminal group DA1 that is an adapter row R1 terminal group and terminal groups DA3, DA4 that are an adapter row R3/R4 terminal group to connect to a connector are provided on a surface of the adapter AP1. The terminals of the terminal groups DA1, DA3, DA4 can be arranged correspondingly to the terminal arrangements of the rows R1, R3, R4 of the memory card SD4 respectively.

Lead pins IA1 that are an adapter row R1 contact group and lead pins IA2 that are an adapter row R2 contact group to connect to the memory card side are provided on an inner surface of the inserting portion IE1 of the adapter AP1. The lead pins IA1 can be arranged correspondingly to the terminal arrangement of the row R1 of the memory card SD1. The lead pins IA2 can be arranged correspondingly to the terminal positions of the terminals of the row R2 of the memory card SD1 to which the transmit differential signals TX0P, TX0N, receive differential signals RX0P, RX0N, and power supply VDD are assigned.

The adapter row R1 contact group of the lead pins IA1 are wired to the terminal group DA1, i.e., the adapter row R1 terminal group to be able to connect to the connector. The adapter row R2 contact group of the lead pins IA2 are wired to the terminal group DA4, i.e., the connector row R4 terminal group (or the terminal group DA3, i.e., the connector row R3 terminal group) to be able to connect to the connector. FIG. 5 illustrates the case of connecting to the row R4 as an example. A lead to the power supply terminal VDD3 and data line leads are indicated by broken lines, with leads to GND terminals being omitted from the figures for ease of seeing.

The terminal groups DA1, DA3, DA4 can be used as the adapter terminal groups of the adapter AP1. The lead pins IA1, IA2 can be used as the adapter contact groups of the adapter AP1. The adapter terminal groups can be in contact with the connector contact groups when the adapter AP1 is attached to the connector. The adapter contact groups can be in contact with the card terminal groups when the memory card SD is inserted into the adapter AP1.

The lead pins IA1 are connected to the terminals of the terminal group DA1 via leads HA1 one-to-one. The lead pins IA2 are connected to the terminals of the terminal group DA4 (or DA3) via leads HA2 one-to-one. Since in the initialization sequence the host device can recognize to which of the terminal groups DA3, DA4 a card is connected, a card can be connected to either of them. Since the leads are shorter when a card is connected to the terminal group DA4, an example of this is shown in the figure.

When the memory card SD1 is attached to the adapter AP1, the memory card SD1 is inserted from the back end of the adapter AP1 into the inserting portion IE1.

At this time, as shown in FIGS. 12C and 12D, the terminals of the terminal group PA1 of the row R1 of the memory card SD1 can be made in contact with the lead pins IA1, and the terminals of the terminal group PA2 of the row R2 of the memory card SD1 can be made in contact with the lead pins IA2. Thus, the form factor of the memory card SD1 can be converted to the form factor of the memory card SD4.

Sixteenth Embodiment

Figure 14A:
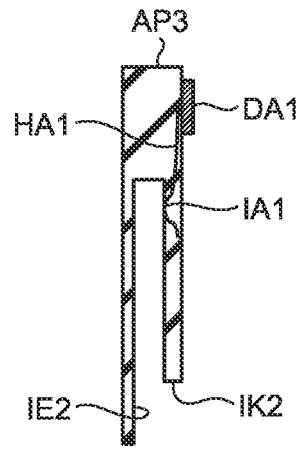
FIG. 14A is a cross-sectional view schematically illustrating an example configuration of an adapter before a memory card is attached, according to a sixteenth embodiment.
Figure 14B:
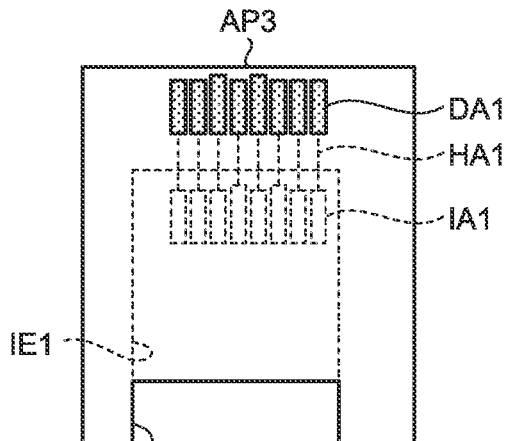
FIG. 14B is a plan view schematically illustrating the example configuration of the adapter before the memory card is attached, according to the sixteenth embodiment.
Figure 14C:
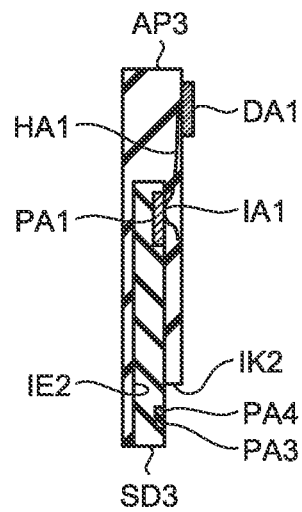
FIG. 14C is a cross-sectional view schematically illustrating an example configuration of the adapter after the memory card is attached, according to the sixteenth embodiment.
Figure 14D:
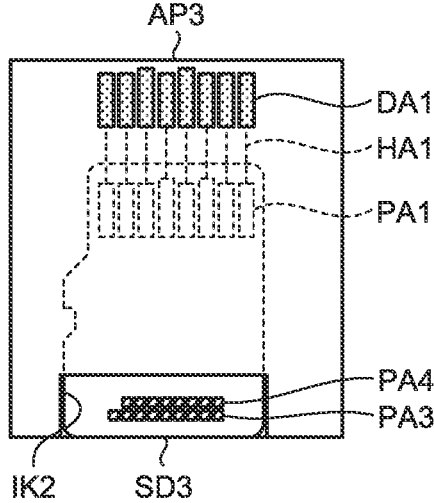
FIG. 14D is a plan view schematically illustrating the example configuration of the adapter after the memory card is attached, according to the sixteenth embodiment.

FIG. 14A is a cross-sectional view schematically illustrating an example configuration of an adapter before a memory card is attached, according to a sixteenth embodiment. FIG. 14B is a plan view schematically illustrating the example configuration of the adapter before the memory card is attached, according to the sixteenth embodiment. FIG. 14C is a cross-sectional view schematically illustrating an example configuration of the adapter after the memory card is attached, according to the sixteenth embodiment. FIG. 14D is a plan view schematically illustrating the example configuration of the adapter after the memory card is attached, according to the sixteenth embodiment.

This embodiment illustrates the adapter that converts the form factor of the memory card SD3 of FIG. 4A to the form factor of the memory card SD4 of FIG. 4B.

In FIGS. 13A and 13B, an inserting portion IE2 through which the memory card SD3 is to be inserted into the adapter AP3 is provided in the adapter AP3. The inlet to the inserting portion IE2 can be provided at the back end of the adapter AP3. A notch IK2 is provided in the inserting portion IE2 so that the terminal groups PA3, PA4 of the rows R3, R4 of the memory card SD3 are exposed at a surface of the adapter AP3 when the memory card SD3 is inserted into the inserting portion IE2.

The position of the inserting portion IE2 can be set such that the placement positions of the terminals of the terminal groups PA3, PA4 of the rows R3, R4 of the memory card SD3 correspond to the placement positions of the terminals of the terminal groups PB3, PB4 of the rows R3, R4 of the memory card SD4 when the memory card SD3 is inserted into the inserting portion IE2.

A terminal group DA1 is provided on the surface of the adapter AP3. The terminals of the terminal group DA1 can be arranged correspondingly to the terminal arrangement of the row R1 of the memory card SD4.

Lead pins IA1 are provided on an inner surface of the inserting portion IE2 of the adapter AP3. The lead pins IA1 can be arranged correspondingly to the terminal arrangement of the row R1 of the memory card SD3. The lead pins IA1 are connected to the terminals of the terminal group DA1 via leads HA1 one-to-one.

When the memory card SD3 is attached to the adapter AP3, the memory card SD3 is inserted from the back end of the adapter AP3 into the inserting portion IE2.

At this time, as shown in FIGS. 13C and 13D, the terminals of the terminal group PA1 of the row R1 of the memory card SD3 can be made in contact with the lead pins IA1. When the terminals of the terminal group PA1 of the row R1 of the memory card SD3 are made in contact with the lead pins IA1, the placement relation between the terminal group DA1 of the adapter AP3 and the terminal groups PA3, PA4 of the memory card SD3 can be made to coincide with the placement relation between the terminal groups PB1, PB3, PB4 of the memory card SD4. Thus, the form factor of the memory card SD3 can be converted to the form factor of the memory card SD4.

Since, when the memory card SD3 is attached to the adapter AP3, the terminal groups PA3, PA4 of the memory card SD3 are exposed at a surface of the adapter AP3, contact with the terminal groups PA3, PA4 of the memory card SD3 can be made without terminal groups of the adapter AP3 being interposed. Thus, also when the form factor of the memory card SD3 is converted to the form factor of the memory card SD4, the terminal groups PA3, PA4 of the memory card SD3 need not be made in contact with terminal groups of the adapter AP3. As a result, when the memory card SD3 is attached to the adapter AP3, electrical characteristics of the terminal groups PA3, PA4 of the memory card SD3 can be prevented from degrading.

Seventeenth Embodiment

Figure 15A:
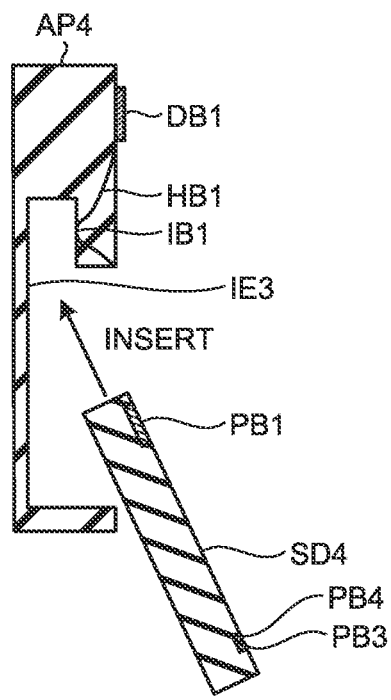
FIG. 15A is a cross-sectional view schematically illustrating an example configuration of an adapter before a memory card is attached, according to a seventeenth embodiment.
Figure 15B:
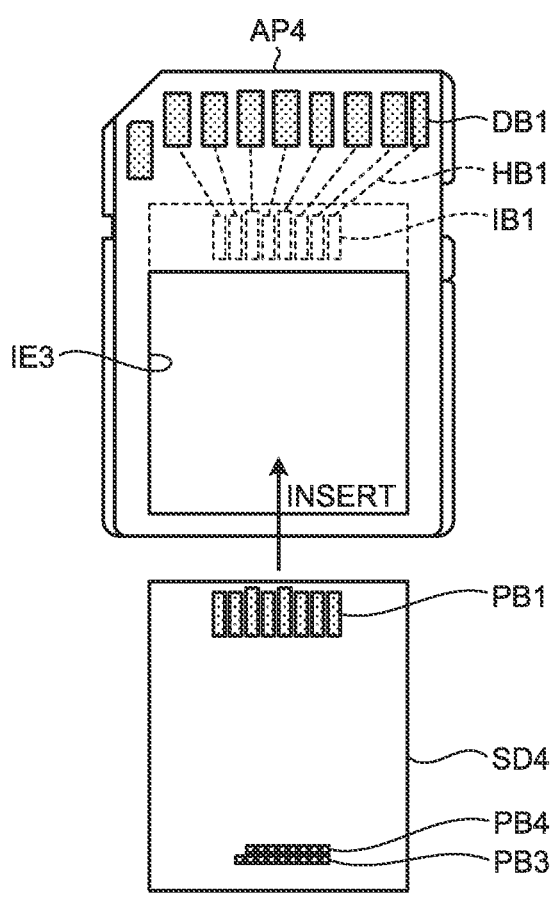
FIG. 15B is a plan view schematically illustrating the example configuration of the adapter before the memory card is attached, according to the seventeenth embodiment.
Figure 15C:
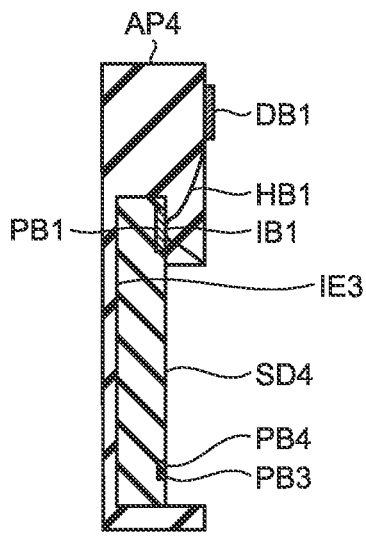
FIG. 15C is a cross-sectional view schematically illustrating an example configuration of the adapter after the memory card is attached, according to the seventeenth embodiment.
Figure 15D:
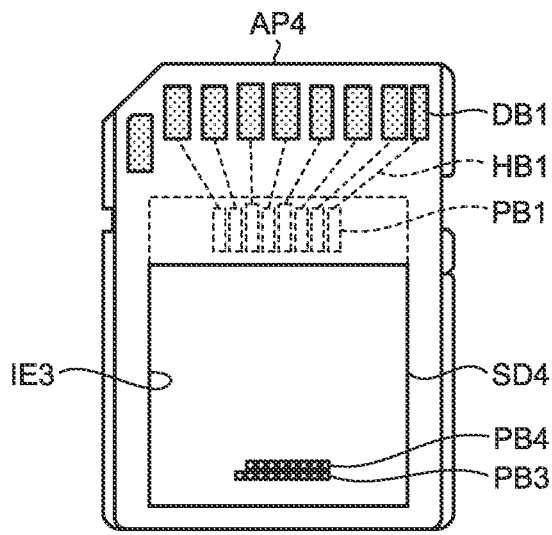
FIG. 15D is a plan view schematically illustrating the example configuration of the adapter after the memory card is attached, according to the seventeenth embodiment.

FIG. 15A is a cross-sectional view schematically illustrating an example configuration of an adapter before a memory card is attached, according to a seventeenth embodiment. FIG. 15B is a plan view schematically illustrating the example configuration of the adapter before the memory card is attached, according to the seventeenth embodiment. FIG. 15C is a cross-sectional view schematically illustrating an example configuration of the adapter after the memory card is attached, according to the seventeenth embodiment. FIG. 15D is a plan view schematically illustrating the example configuration of the adapter after the memory card is attached, according to the seventeenth embodiment.

This embodiment illustrates the adapter that converts the form factor of the memory card SD4 of FIG. 4B to the form factor of the memory card SD5 of FIG. 4C.

In FIGS. 14A and 14B, an inserting portion IE3 through which the memory card SD4 is to be inserted into the adapter AP4 is provided in the adapter AP4. The inlet to the inserting portion IE3 can be provided at a surface of the adapter AP4. Through the inlet to the inserting portion IE3, the terminal groups PA3, PA4 of the rows R3, R4 of the memory card SD4 can be exposed at a surface of the adapter AP4 when the memory card SD4 is inserted into the inserting portion IE3.

The position of the inserting portion IE3 can be set such that the placement positions of the terminals of the terminal groups PB3, PB4 of the rows R3, R4 of the memory card SD4 correspond to the placement positions of the terminals of the terminal groups PC3, PC4 of the rows R3, R4 of the memory card SD5 when the memory card SD4 is inserted into the inserting portion IE3.

A terminal group DB1 is provided on the surface of the adapter AP4. The terminals of the terminal group DB1 can be arranged correspondingly to the terminal arrangement of the row R1 of the memory card SD5.

Lead pins IB1 are provided on an inner surface of the inserting portion IE3 of the adapter AP4. The lead pins IB1 can be arranged correspondingly to the terminal arrangement of the row R1 of the memory card SD4. The lead pins IB1 are connected to the terminals of the terminal group DB1 via leads HB1 one-to-one.

When the memory card SD4 is attached to the adapter AP4, the memory card SD4 is inserted from the surface of the adapter AP4 into the inserting portion IE3.

At this time, as shown in FIGS. 14C and 14D, the terminals of the terminal group PB1 of the row R1 of the memory card SD4 can be made in contact with the lead pins IB1. When the terminals of the terminal group PB1 of the row R1 of the memory card SD4 are made in contact with the lead pins IB1, the placement relation between the terminal group DB1 of the adapter AP4 and the terminal groups PB3, PB4 of the memory card SD4 can be made to coincide with the placement relation between the terminal groups PC1, PC3, PC4 of the memory card SD5. Thus, the form factor of the memory card SD4 can be converted to the form factor of the memory card SD5.

Since, when the memory card SD4 is attached to the adapter AP4, the terminal groups PB3, PB4 of the memory card SD4 are exposed at a surface of the adapter AP4, contact with the terminal groups PB3, PB4 of the memory card SD4 can be made without terminal groups of the adapter AP4 being interposed. Thus, also when the form factor of the memory card SD4 is converted to the form factor of the memory card SD5, the terminal groups PB3, PB4 of the memory card SD4 need not be made in contact with terminal groups of the adapter AP4. As a result, when the memory card SD4 is attached to the adapter AP4, electrical characteristics of the terminal groups PB3, PB4 of the memory card SD4 can be prevented from degrading.

Eighteenth Embodiment

Figure 16A:
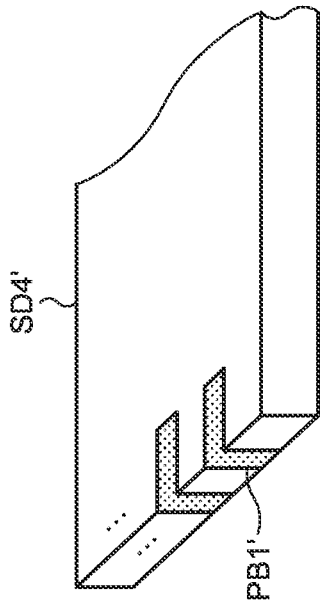
FIG. 16A is a perspective view schematically illustrating the configuration of a memory card according to an eighteenth embodiment.

FIG. 16A is a perspective view schematically illustrating the configuration of a memory card according to an eighteenth embodiment. FIG. 16A illustrates a modified example of the memory card SD4 of FIG. 4B.

In FIG. 16A, instead of the terminal group PB1 of the memory card SD4, a terminal group PB1' is provided on a memory card SD4'. The terminals of the terminal group PB1' are placed extending across a surface and then the front end surface of the memory card SD4'. Thus, contact with the terminals of the row R1 of the memory card SD4' can be made at the end of the memory card SD4'.

Nineteenth Embodiment

Figure 16B:
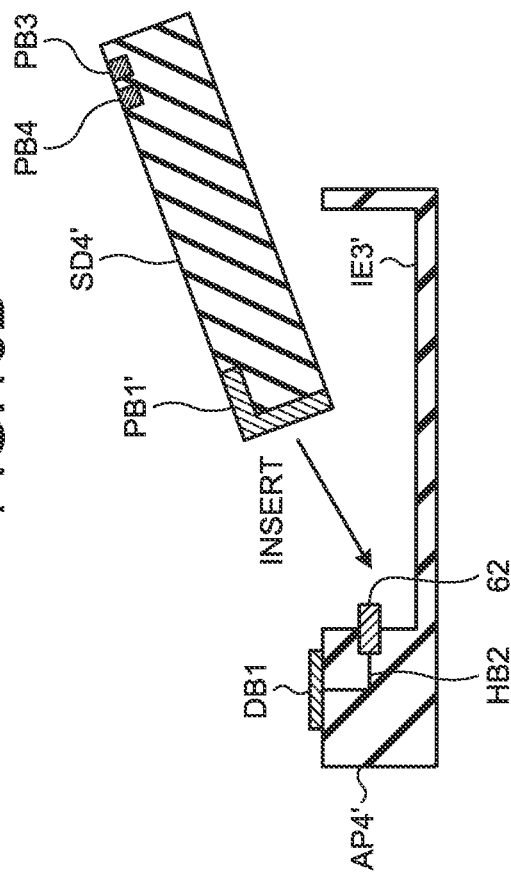
FIG. 16B is a cross-sectional view schematically illustrating an example configuration of an adapter before a memory card is attached, according to a nineteenth embodiment.

FIG. 16B is a cross-sectional view schematically illustrating an example configuration of an adapter before a memory card is attached, according to a nineteenth embodiment. FIG. 16B illustrates a modified example of the adapter AP4 of FIGS. 14A to 14D.

In FIG. 16B, instead of the inserting portion IE3, lead pins IB1, and leads HB1 of the adapter AP4, an inserting portion IE3', docking pins 62, and leads HB2 are provided in an adapter AP4'. The docking pins 62 are embedded in an end side surface of the inserting portion IE3'. The docking pins 62 are connected to the terminals of the terminal group DB1 via leads HB2 one-to-one.

When the memory card SD4' is attached to the adapter AP4', the memory card SD4' is inserted from the surface of the adapter AP4' into the inserting portion IE3'. At this time, since the ends of the terminals of the terminal group PB1' of the row R1 of the memory card SD4' are fastened by pressure to the docking pins 62, stable contact can be made.

As shown in FIG. 15C, when the memory card SD4 is attached to the adapter AP4, a step occurs between the terminal group DB1 of the adapter AP4 and the terminal groups PB3, PB4 of the memory card SD4. When a connector is made in contact with these terminal groups DB1, PB3, PB4, the connector needs to accommodate the step.

In contrast, when the memory card SD4' is attached to the adapter AP4', there can be almost no step between the terminal group DB1 of the adapter AP4' and the terminal groups PB3, PB4 of the memory card SD4'. Hence, a connector to be in contact with the terminal groups DB1, PB3, PB4, need not accommodate the step, so that the structure of the connector can be prevented from becoming complex.

Twentieth Embodiment

Figure 16C:
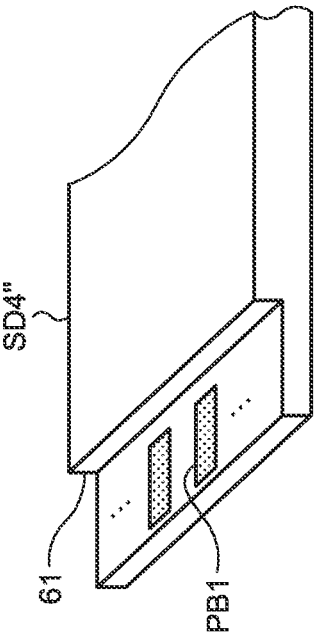
FIG. 16C is a perspective view schematically illustrating the configuration of a memory card according to a twentieth embodiment.
Figure 16D:
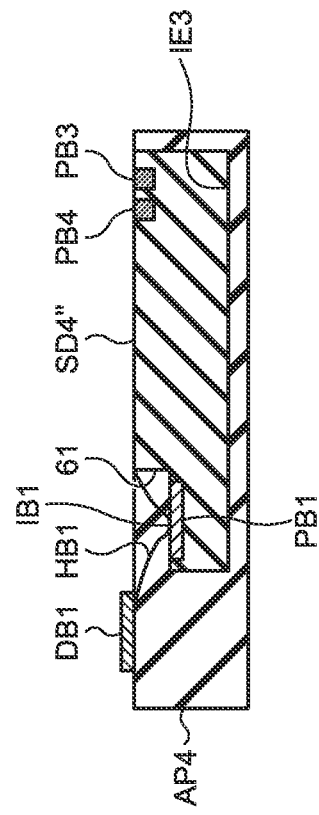
FIG. 16D is a cross-sectional view illustrating the state of an adapter after the memory card of FIG. 16C is attached.

FIG. 16C is a perspective view schematically illustrating the configuration of a memory card according to a twentieth embodiment. FIG. 16D is a cross-sectional view illustrating the state of an adapter after the memory card of FIG. 16C is attached. FIG. 16C illustrates a modified example of the memory card SD4 of FIG. 4B.

In FIG. 16C, a step 61 is provided in an end of the memory card SD4". In this case, the terminal group PB1 can be placed in a position lower by the height of the step 61.

When the memory card SD4" is attached to the adapter AP4, the memory card SD4" is inserted from the surface of the adapter AP4 into the inserting portion IE3. At this time, the terminals of the terminal group PB1 of the row R1 of the memory card SD4" can be made in contact with the lead pins IB1.

As shown in FIG. 15C, when the memory card SD4 is attached to the adapter AP4, a step occurs between the terminal group DB1 of the adapter AP4 and the terminal groups PB3, PB4 of the memory card SD4.

In contrast, when the memory card SD4" is attached to the adapter AP4, there can be almost no step between the terminal group DB1 of the adapter AP4 and the terminal groups PB3, PB4 of the memory card SD4". Hence, a connector to be in contact with the terminal groups DB1, PB3, PB4, need not accommodate the step, so that the structure of the connector can be prevented from becoming complex.

Twenty-First Embodiment

Figure 17:
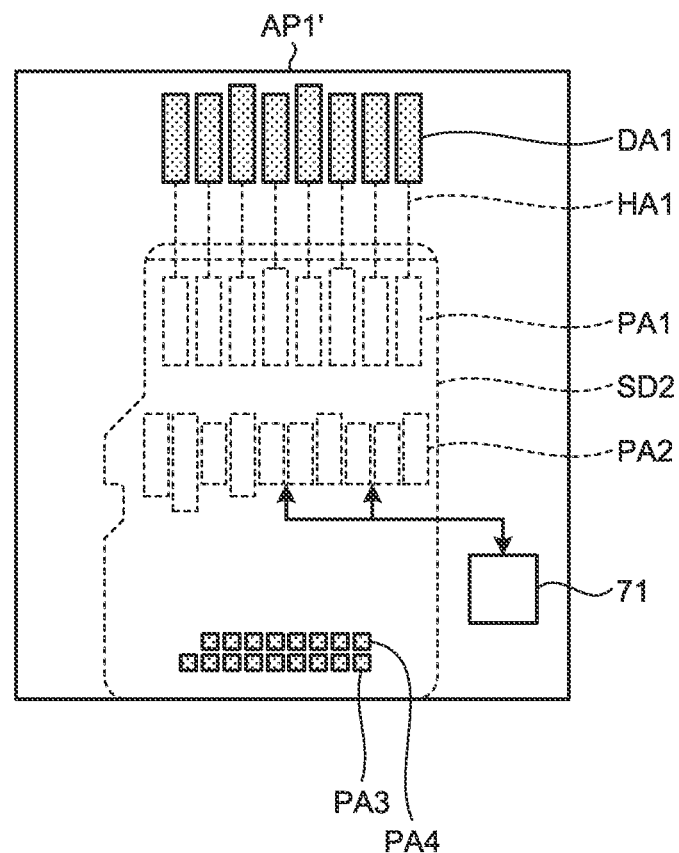
FIG. 17 is a plan view schematically illustrating an example configuration of an adapter after a memory card is attached, according to a twenty-first embodiment.

FIG. 17 is a plan view schematically illustrating an example configuration of an adapter after a memory card is attached, according to a twenty-first embodiment. FIG. 17 illustrates a modified example of the adapter AP1 of FIGS. 12A to 12D.

In FIG. 17, a semiconductor chip 71 is provided in an adapter AP1'. Not being limited to the position shown in the figure, the mounting position of the semiconductor chip 71 is arbitrary, and the semiconductor chip 71 can be embedded in an empty space of the adapter AP1'. The semiconductor chip 71 is connected to the lead pins IA2 of FIGS. 13A and 12B.

The semiconductor chip 71 can be made to have a function such as a radio module, a proximity radio module, a secure module, or a sensor for smells, illumination, or so on.

The radio module can be made compliant with a standard such as 11a, 11b, 11g, 11n, 11ad, or WiGig. The proximity radio module can be made compliant with a standard such as NFC, Zwave, ZigBee, or Transfer Jet. The secure module can be made compliant with a standard such as Trusted Execution Environment (TEE), Trusted Computing Group (TCG), or OPAL.

When the memory card SD2 is attached to the adapter AP1', the semiconductor chip 71 connects to the host device via the rows R3, R4 of the memory card SD2 and can connect to the memory card via the terminals of the row R2 of the memory card SD2. Thus, by attaching the adapter AP1' having the memory card SD2 attached thereto to the host device, the host device can be made to have a function such as the radio module, the secure module, or the sensor.

Twenty-Two Embodiment

Figure 18:
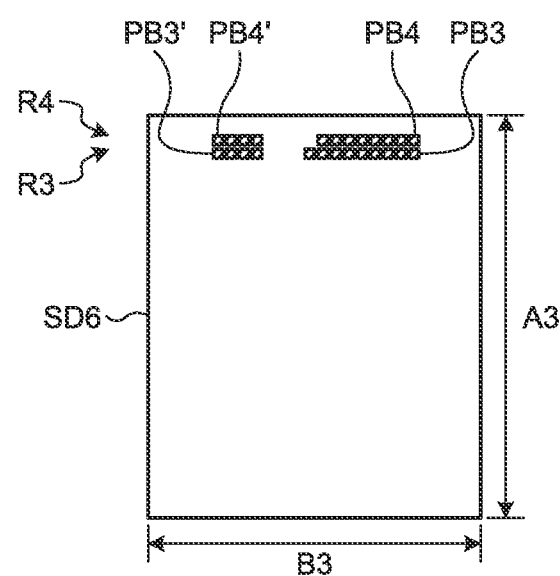
FIG. 18 is a plan view schematically illustrating the configuration of a memory card according to a twenty-two embodiment.

FIG. 18 is a plan view schematically illustrating the configuration of a memory card according to a twenty-two embodiment. FIG. 18 illustrates a modified example of the memory card SD4 of FIG. 4B.

In FIG. 18, in a memory card SD6, the terminal group PB1 of the row R1 of the memory card SD4 is removed. And the rows R3, R4 are provided in the position in which the row R1 is on the memory card SD4. The terminal groups PB3', PB4', instead of control signal terminals that would otherwise be in the row R1, in addition to the terminal groups PB3, PB4 of differential signals of the memory card SD4 are respectively provided in the rows R3, R4 of the memory card SD6. The terminal groups PB3', PB4' can be different in shape and the number of terminals from the terminals of the row R1, but, when the terminal groups PB3', PB4' take over the functions of the row R1, the memory card SD6 can maintain compatibility. That is, the memory card SD6 can be converted into the memory card SD5 by using an adapter.

The memory card SD6 can be made to have the function of communication in the second mode compliant with the PCIe standard. In this case, control signals used in the control of communication in the second mode compliant with the PCIe standard are assigned to the terminal groups PB3', PB4'. As these control signals, the reference differential clock signals REFCLKp/n, reset signal PERST, power management control signal CLKREQ, and wakeup signal PEWAKE can be used. Further, as these control signals, the wakeup signal PEWAKE can be also used.

By removing the terminal group PB1 of the row R1 of the memory card SD4 and providing the terminal groups PB3, PB3' PB4, PB4' in the rows R3, R4 of the memory card SD6, empty space in the card surface of the memory card SD6 can be increased while the memory card SD6 is made to have the function of communication in the second mode compliant with the PCIe standard. Therefore, the number of rows of the memory card SD6 can be easily increased, so that the number of lanes of the PCIe standard can be easily increased, and thus the data transfer speed of the memory card SD6 can be easily improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A memory card comprising:
   a first row of a first terminal group including three or more terminals; and
   a second row of a second terminal group including three or more terminals, the second row extending in a direction parallel to a direction of the first row, wherein the first terminal group includes:
      a plurality of differential data terminals to communicate differential data signals, and
      a plurality of ground terminals connected to a ground potential,
   the plurality of differential data terminals includes a pair of differential data terminals arranged adjacent to each other,
   the pair of differential data terminals includes
      a pair of differential data terminals to transmit differential signals, and
      a pair of differential data terminals to receive differential signals,
   the plurality of ground terminals includes a first ground terminal, a second ground terminal, and a third ground terminal,
   the pair of differential data terminals to transmit is placed between the first ground terminal and the second ground terminal, and
   the pair of differential data terminals to receive is placed between the second ground terminal and the third ground terminal.

2. The memory card according to claim 1, wherein the differential data signals are compliant with a Peripheral Component Interconnect express (PCIe) standard.

3. The memory card according to claim 2, further comprising:
   a controller, wherein
   the controller includes a physical interface layer with a transmitter and a receiver.

4. The memory card according to claim 3, further comprising:
a NAND flash memory; and
a memory interface circuit, wherein
the controller is coupled to the NAND flash memory via the memory interface circuit.

5. The memory card according to claim 4, wherein a thickness of the memory card is in a range of 1.30 mm to 1.50 mm.

6. The memory card according to claim 1, wherein the second terminal group includes a plurality of ground terminals connected to a ground potential.

7. The memory card according to claim 1, further comprising:
a third row of a third terminal group including three or more terminals, the third row extending in the direction parallel to a direction of the first row.

8. The memory card according to claim 7, wherein the third terminal group includes a plurality of ground terminals connected to a ground potential.

9. The memory card according to claim 8, wherein the third terminal group includes a power supply terminal assigned to a power supply.

10. The memory card according to claim 9, further comprising a regulator,
wherein a power supply voltage supplied to the power supply terminal is supplied to the regulator.

11. The memory card according to claim 10, wherein the power supply voltage supplied to the regulator is supplied to a physical interface layer.

12. The memory card according to claim 11, wherein the power supply voltage supplied to the regulator is converted into a power supply voltage for operating the physical interface layer, and
the converted power supply voltage is supplied to the physical interface layer.

13. The memory card according to claim 9, wherein the memory card is connectable to a host.

14. The memory card according to claim 13, wherein the host is configured to supply a power supply voltage to the memory card through the power supply terminal, and
the power supply voltage is supplied to a regulator and is converted into a power supply voltage for operating a physical interface layer.

* * * * *